United States Patent [19]
Oga et al.

[11] Patent Number: 5,708,295
[45] Date of Patent: Jan. 13, 1998

[54] LEAD FRAME AND METHOD OF MANUFACTURING THE SAME, AND RESIN SEALED SEMICONDUCTOR DEVICE AND METHOD OF MANUFACTURING THE SAME

[75] Inventors: Akira Oga; Yukio Yamaguchi, both of Shiga; Toru Nomura, Hyogo; Masanori Minamio, Osaka, all of Japan

[73] Assignee: Matsushita Electronics Corporation, Osaka, Japan

[21] Appl. No.: 638,043

[22] Filed: Apr. 26, 1996

[30] Foreign Application Priority Data

Apr. 28, 1995 [JP] Japan ................................. 7-105491
May 18, 1995 [JP] Japan ................................. 7-119850

[51] Int. Cl.⁶ ............................................... H01L 23/495
[52] U.S. Cl. ...................................... 257/676; 257/666
[58] Field of Search .............................. 257/666, 668, 257/672, 676

[56] References Cited

U.S. PATENT DOCUMENTS 5,378,656  1/1995  Kajihara et al. ............... 437/217
5,457,341  10/1995  West ............................... 257/666

FOREIGN PATENT DOCUMENTS 5-13382   2/1993  Japan .
5-243455  9/1993  Japan ............................... 257/666
6-151684  5/1994  Japan ............................... 257/666

*Primary Examiner*—Jerome Jackson
*Assistant Examiner*—Nathan K. Kelley
*Attorney, Agent, or Firm*—McDermott, Will & Emery

[57] ABSTRACT

In a space surrounded by outer frames formed in the shape of as rectangle is disposed a die pad in the shape of a square for mounting a semiconductor chip having electrodes. Each of the outer frames is connected with a plurality of outer leads respectively continuous with inner leads which are used for electrical connection and extended toward the die pad. Each inner lead is extended to the vicinity of a position where each electrode of the semiconductor chip is to be formed. The corners of the die pad are respectively provided with support members extending to positions away from a dam bar by a predetermined distance. The support members are connected with the inner leads via a square ring-shaped insulating member. Thus, the die pad is supported by the outer frames via the support members. Since there is no need to provide a die pad lead, the space at the corner conventionally occupied by the die pad lead can be utilized for wiring, and the leads can be easily led in.

16 Claims, 15 Drawing Sheets

LEAD FRAME AND METHOD OF MANUFACTURING THE SAME, AND RESIN SEALED SEMICONDUCTOR DEVICE AND METHOD OF MANUFACTURING THE SAME

BACKGROUND OF THE INVENTION

The present invention relates to a lead frame to be used in a resin sealed semiconductor device for mounting a semiconductor chip such as an integrated circuit and a transistor.

A conventional lead frame will now be described referring to drawings.

FIG. 13 is a plane view for showing the configuration of the conventional lead frame. As is shown in FIG. 13, the conventional lead frame comprises first through fourth outer frames 10a through 10d in the shape of a rectangle surrounding a predetermined space; a die pad 1 in the shape of a square having first through fourth sides 1a through 1d, which are respectively parallel to the first through fourth outer frames 10a through 10d, for mounting a semiconductor chip; first through fourth outer lead groups 6 through 9 respectively connected with the first through fourth outer frames 10a through 10d for providing connection with external terminals; first through fourth inner lead groups 2 through 5 respectively extending from the first through fourth outer lead groups 6 through 9 to the vicinity of positions where the electrodes of the semiconductor chip are to be formed, so as to be electrically connected with the electrodes of the semiconductor chip via connection means such as a metal wire; a dam bar 11 for binding respective outer leads of the first through fourth outer lead groups 6 through 9 to one another; and die pad leads 13 for connecting the corners of the die pad 1 with the corners of the dam bar 11. The die pad 1 is supported by the dam bar 11 via the die pad leads 13, namely, ultimately by the outer frames 10a through 10d.

FIGS. 14(a) and 14(b) are partial plane views for showing conventional production procedures for realizing the configuration of the lead frame shown in FIG. 13. FIGS. 14(a) and 14(b) merely show the upper right portion of the lead frame for the sake of simplification.

First, as is shown in FIG. 14(a), a metal plate is subjected to an etching process or press working, thereby forming a first lead frame body 14 including the first through fourth outer frames 10a through 10d (among which the second and third outer frames 10b and 10c are not shown); the die pad 1 in the shape of a square having the four sides 2 through 4 (among which the second and third sides 3 and 4 are not shown); the first through fourth outer lead groups 6 through 9 (among which the outer lead groups 7 and 8 are not shown) respectively connected with the outer frames 10a through 10d; the first through fourth inner lead groups 2 through 5 (among which the second and third inner lead groups 3 and 4 are not shown) respectively extending from the first through fourth outer lead groups 6 through 9; the dam bar 11; and the die pad leads 13 for connecting the corners of the die pad 1 with the corners of the dam bar 11. At this point, adjacent two inner leads are mutually connected at their tips via a tip connection area 12. Furthermore, subsequently to this procedure, the entire lead frame body can be plated if necessary.

Next, as is shown in FIG. 14(b), the tip connection area 12 of each inner lead is cut off so as to separate the respective inner leads from one another, thereby forming a second lead frame body 15.

FIG. 15 is a plane view for showing the state of the lead frame after mounting a semiconductor chip and before conducting resin sealing. Specifically, a semiconductor chip 16 in the shape of a square is mounted on the die pad 1 of the lead frame, and electrodes (bonding pads) 18 of the semiconductor chip 16 are connected with the respective inner leads via metal wires (bonding wires) 19. At this point, the semiconductor chip 16 is disposed so that first through fourth sides 16a through 16d thereof are respectively parallel to the first through fourth outer frames 10a through 10d.

However, the die pad leads 13, which are supported by the dam bar 11 in this conventional lead frame, can impose restrictions on the lead-in (alignment) of the inner leads when the number of the leads increases as a result of the increase of the number of pins provided to the semiconductor chip. Specifically, as is shown in FIG. 15, in the case where the lead frame is in the shape of the rectangle with the longer first and third outer frames 10a and 10c and the shorter second and fourth outer frames 10b and 10d and the semiconductor chip 16 is in the shape of a square, it is necessary to provide the longer outer frames 10a and 10c with larger number of leads because there is a limit in minimization of the pitch between the leads. On the other hand, the pitch between the electrodes 18 of the semiconductor chip 16 also cannot be minimized limitlessly, and hence, it is necessary to provide equal number of electrodes 18 along each of the sides 16a through 16d of the semiconductor chip 16. Accordingly, among the inner leads of the inner lead groups 2 and 4 connected with the first and third outer frames 10a and 10c, some of the inner leads at the ends (the number of which is not limited to one) are connected with the electrodes 18 along the second and fourth sides 16b and 16d of the semiconductor chip 16 via the metal wires 19. As a result, it is necessary to extend some of the metal wires 19 across the die pad leads 13. In contrast, in the case where the semiconductor chip is in the shape of a rectangle and the outer frames are in the shape of a square, the connection by means of the metal wires becomes difficult when bonding pads are disposed on the shorter sides of the semiconductor chip. As a result, there arises a problem that a short-circuit can be caused.

In this manner, the conventional lead frame and the resin sealed semiconductor device using the lead frame have been largely disadvantageous in view of the design of wire connection in the lead frame and the reliability of the completed semiconductor device.

SUMMARY OF THE INVENTION

The present invention was devised to overcome the aforementioned problems. The object is providing a lead frame to be used in a resin sealed semiconductor device having improved reliability and applicable to the increase of the number of pins of a semiconductor chip, by providing means for enlarging the freedom in leading inner leads to an adjacent area, and also providing a method of manufacturing the lead frame, a resin sealed semiconductor device using the lead frame and a method of manufacturing the resin sealed semiconductor device.

The first lead frame of this invention basically comprises outer frames for surrounding a predetermined space; a die pad disposed in the space surrounded by the outer frames for mounting a semiconductor chip having electrodes; a plurality of leads extending from the outer frames to the vicinity of positions where the electrodes of the semiconductor chip are to be formed so as to be electrically connected with the electrodes of the semiconductor chip; at least two support members extending from the die pad to positions away from the outer frames by a predetermined distance; and at least one insulating member for connecting the support members with at least one of the plural leads.

Owing to this configuration, the die pad is supported by the outer frames via the support members and the leads to be used for wiring, and hence, there is no need to provide a die pad lead for connecting the die pad with the outer frames or the dam bar. For example, although a lead frame to be used in a QFP type resin sealed semiconductor device is provided with the support members between the corners of the die pad and the corners of the outer frames, there exists a space between the tip of each support member and the outer frame (or the dam bar). Therefore, the space conventionally occupied by the die pad lead can be freely utilized for wiring. Since the support members can be appropriately disposed at necessary portions of the die pad in this manner, there is no restriction in the lead-in (alignment) of the inner leads. Furthermore, in a resin sealed semiconductor device using such a lead frame, a resin which is injected in a diagonal direction in a resin sealing process meets with smaller resistance. Therefore, fewer cells are formed in the resin, resulting in manufacturing a semiconductor device including few voids in the resin, namely, having improved reliability.

Each of the support members can be connected with all the leads via a common ring-shaped insulating member, or can be partially connected with merely some of the leads.

In particular, it is preferred that the tip of each support member is extended toward the corner of the outer frames.

Owing to this configuration, the outer frames enhances the function to support the die pad via the insulating member and the support members.

The second lead frame of this invention has the aforementioned basic configuration, and the tip of at least one specific lead among the plural leads is aligned along one side of the virtual rectangular pattern formed by the tips of the leads, the side being adjacent to another side parallel to the outer frame with which the specific lead is connected.

Owing to this configuration, in accordance with the number of bonding pads of the semiconductor chip to be mounted, a specific part of the inner leads of one inner lead group can be branched to be aligned in the area where the tips of the adjacent inner lead group are arranged. Therefore, problems in the lead-in of the inner leads can be solved. Thus, the pitch between the inner leads is prevented from becoming too small and there is no need to extend a metal wire across the die pad lead as in the conventional lead frame, resulting in preventing the metal wires and the leads from being disconnected and short-circuited due to the flow of the resin in the resin sealing process. In this manner, the reliability of a resin sealed semiconductor device using this lead frame is prevented from degrading.

Furthermore, in order to improve the supporting function of the support members, the following preferred configurations can be appropriately selected:

It is preferred that each of the support members has a larger width at its tip.

It is preferred that each of the support members has a through hole at its tip.

It is preferred that the insulating member is made of a tape-shaped insulating material to which an adhesive agent is applied.

Furthermore, in order to prevent the occurrence of a package crack by decreasing thermal stress caused by a difference in the coefficient of thermal expansion between the die pad and the semiconductor chip, the following preferred configurations can be appropriately selected:

It is preferred that the die pad has an area smaller than an area of the semiconductor chip to be mounted thereon.

It is preferred that the die pad is divided into a plurality of portions.

The production method for a lead frame of this invention basically comprises a first step of fabricating a first lead frame body including outer frames for surrounding a predetermined space, a die pad disposed in the space surrounded by the outer frames for mounting a semiconductor chip having electrodes, a plurality of leads extending from the outer frames to the vicinity of positions where the electrodes of the semiconductor chip are to be formed so as to be electrically connected with the electrodes of the semiconductor chip, at least two support members extending from the die pad to positions away from the outer frames by a predetermined distance, and a connection area for connecting the die pad with at least two of the plural leads; a second step of connecting each of the support members with at least one of the plural leads by using an insulating member; and a third step of cutting off the connection area from the first lead frame body having the insulating member for separating the die pad from the leads, so as to form a second lead frame body.

By adopting this production method, the lead frame which can exhibit the above-mentioned effects can be fabricated with ease.

The aforementioned basic production method for a lead frame is further classified into two methods respectively including the following procedures, either of which can be effective:

According to the first method, in the first step, the plural leads are divided into lead groups each including a plurality of leads, each lead group is provided with a tip connection area for commonly connecting tips of the leads belonging to the lead group, and the connection area is formed between the tip connection area and a portion of the die pad.

According to the second method, in the first step, the connection area is formed between each support member and at least one lead adjacent to the support member, so that the die pad is supported by the lead via the support member.

It is preferred that the first lead frame body is plated after the first step.

This plating can improve the adhesion of the lead frame to the resin to be used.

The aforementioned configuration of the lead frame is applicable to a resin sealed semiconductor device, and it is possible to manufacture a resin sealed semiconductor device by utilizing the aforementioned configuration of the lead frame.

DETAILED DESCRIPTION OF THE INVENTION

The embodiments of the present invention will now be described referring to the accompanying drawings.

(Embodiment 1)

Figure 1:
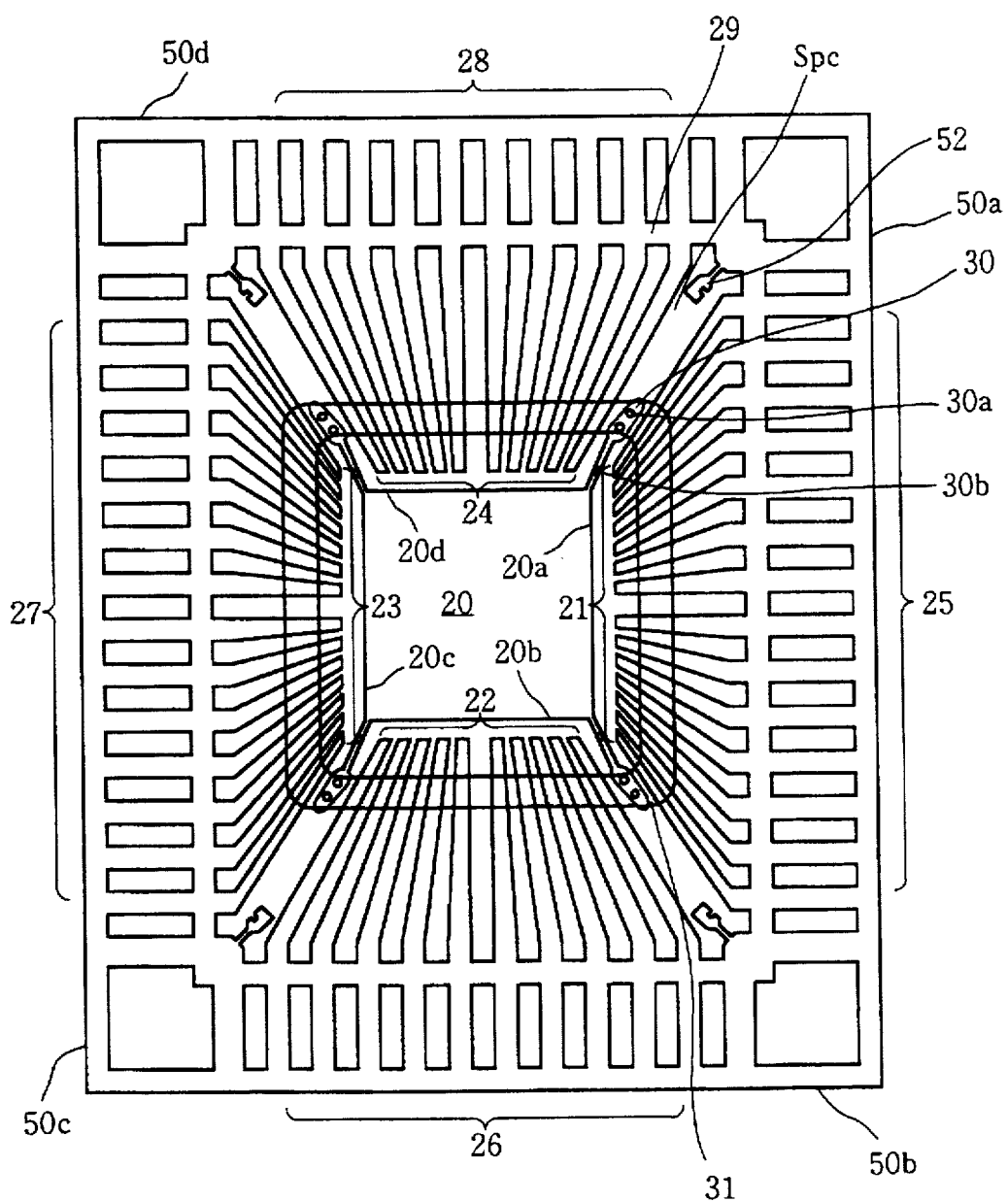
FIG. 1 is a plane view of a lead frame according to a first embodiment of the invention.

FIG. 1 is a plane view of a lead frame according to the first embodiment of the invention. As is shown in FIG. 1, the lead frame of this embodiment is to be used in a QFP (quad flat package) type resin sealed semiconductor device. This lead frame comprises first through fourth outer frames 50a through 50d in the shape of a rectangle surrounding a predetermined space; a die pad 20 for mounting a semiconductor chip which is disposed in the space surrounded by the outer frames 50a through 50d and is in the shape of a square having first through fourth sides 20a through 20d respectively parallel to the first through fourth outer frames 50a through 50d; and a plurality of leads extending from the outer frames 50a through 50d to the vicinity of positions where the electrodes of the semiconductor chip mounted on the die pad 20 are to be formed. The leads are classified into two groups, one of which is a group of inner leads, that is, tip portions of the leads, electrically connected with the electrodes of the semiconductor chip, and the other of which is a group of outer leads, that is, bottom portions of the leads, initially connected with the outer frames 50a through 50d but separated from the outer frames 50a through 50d after sealing the semiconductor chip so as to be connected with external terminals. The outer leads are divided into first through fourth outer lead groups 25 through 28 in accordance with the first through fourth outer frames 50a through 50d with which they are connected at their bottoms. The inner leads are divided into first through fourth inner lead groups 21 through 24 in accordance with the groups of the outer leads with which they are communicated. The outer leads are bound to one another with a ring-shaped dam bar 29 having four sides respectively parallel to the outer frames 50a through 50d. In a plane view, the tips of the inner lead groups 21 through 24 are positioned in the vicinity of the sides 20a through 20d of the die pad 20, but in a three-dimensional view, they are away from the die pad 20 by a distance equal to the thickness of the semiconductor chip. The tips of the inner leads are aligned so as to form a virtual rectangular pattern (which is substantially a square in this embodiment) having four sides respectively parallel to the first through fourth outer frames 50a through 50d. In other words, the virtual rectangular pattern formed by the tips of the inner leads is a rectangle formed by similarly enlarging the sides of the semiconductor chip, and the tips of the inner leads are positioned so as to oppose the positions where the electrodes of the semiconductor chip are to be formed. In this case, the tip of each inner lead is positioned along the side parallel to one of the outer frames 50a through 50d with which that particular lead is connected via the communicating outer lead.

This embodiment is characterized in that the four corners of the die pad 20 are provided with support members 30 for supporting the die pad 20. Each support member 30 extends from one corner of the die pad 20 to one corner of the dam bar 29, but does not reach the dam bar 29 with retaining a predetermined distance from the dam bar 29. Specifically, between the support member 30 and the corner of the dam bar 29 is disposed a space Spc. The tips of the respective support members 30 are commonly connected with the first through fourth inner lead groups 21 through 24 via a ring-shaped insulating member 31 of an insulating line material such as an insulating tape and an insulating resin. Specifically, the support members 30 are connected with the inner lead groups 21 through 24 via the insulating member 31, so as to support the die pad 20 by the outer frames 50a through 50d.

Each support member 30 has a larger width at its tip, so as to be stably connected with the insulating member 31. The tip of the support member 30 has a through hole 30a. When this lead frame is used for manufacturing a resin sealed semiconductor device, the anchor function of this through hole 30a can improve the adhesion to a sealing resin. The support member 30 also has a depressing portion 30b for appropriately adjusting the positional relationship between the die pad 20 and the inner lead groups 21 through 24. Each corner of the dam bar 29 has an anchor member 52 for supporting the corner of the dam bar 29 by the sealing resin after sealing the semiconductor chip and the like.

Figure 2:
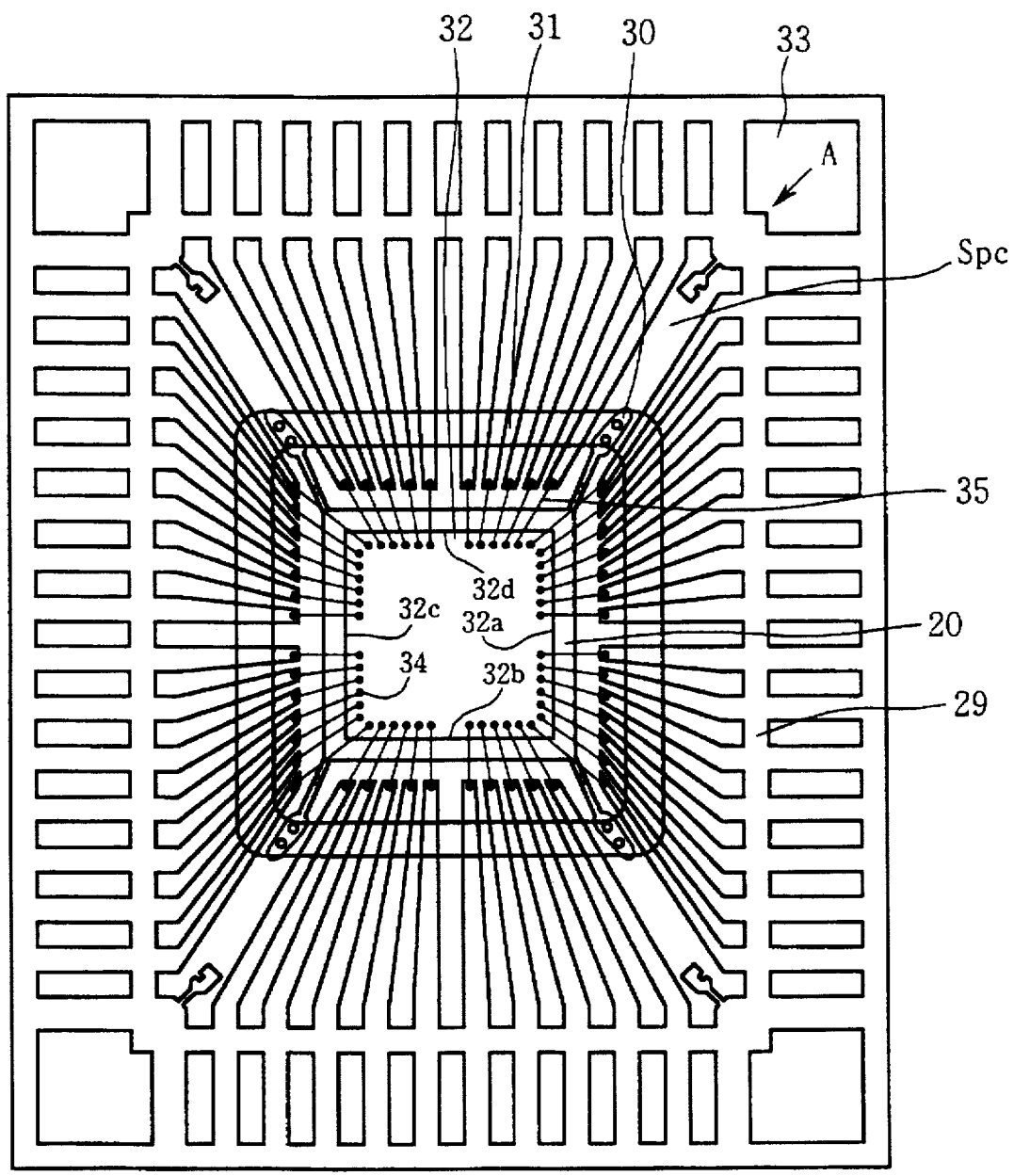
FIG. 2 is a plane view of the lead frame of the first embodiment mounting a semiconductor chip.

FIG. 2 is a plane view for showing the state of the lead frame after mounting a semiconductor chip 32 on the die pad 20 and before conducting resin injection for manufacturing a resin sealed semiconductor device. As is shown in FIG. 2, the semiconductor chip 32 is in the shape of a square having first through fourth sides 32a through 32d, along which electrodes 34 are disposed. The electrodes 34 on the semiconductor chip 32 mounted on the die pad 20 are electrically connected with the inner leads via metal wires (bonding wires) 35. Then, after a resin is injected so as to seal the semiconductor chip 32, the die pad 20, the inner lead groups 21 through 24 and the insulating member 31 within the resin, unnecessary portions of the lead frame, for example, the outer frames 50a through 50d, the dam bar 29 and part of the outer lead groups 25 through 28, are cut off. In this embodiment, the end leads of the first and third inner lead groups 21 and 23 are connected with the electrodes 34 disposed not along the first and third sides 32a and 32c but along the second and fourth sides 32b and 32d of the semiconductor chip 32.

Figure 13:
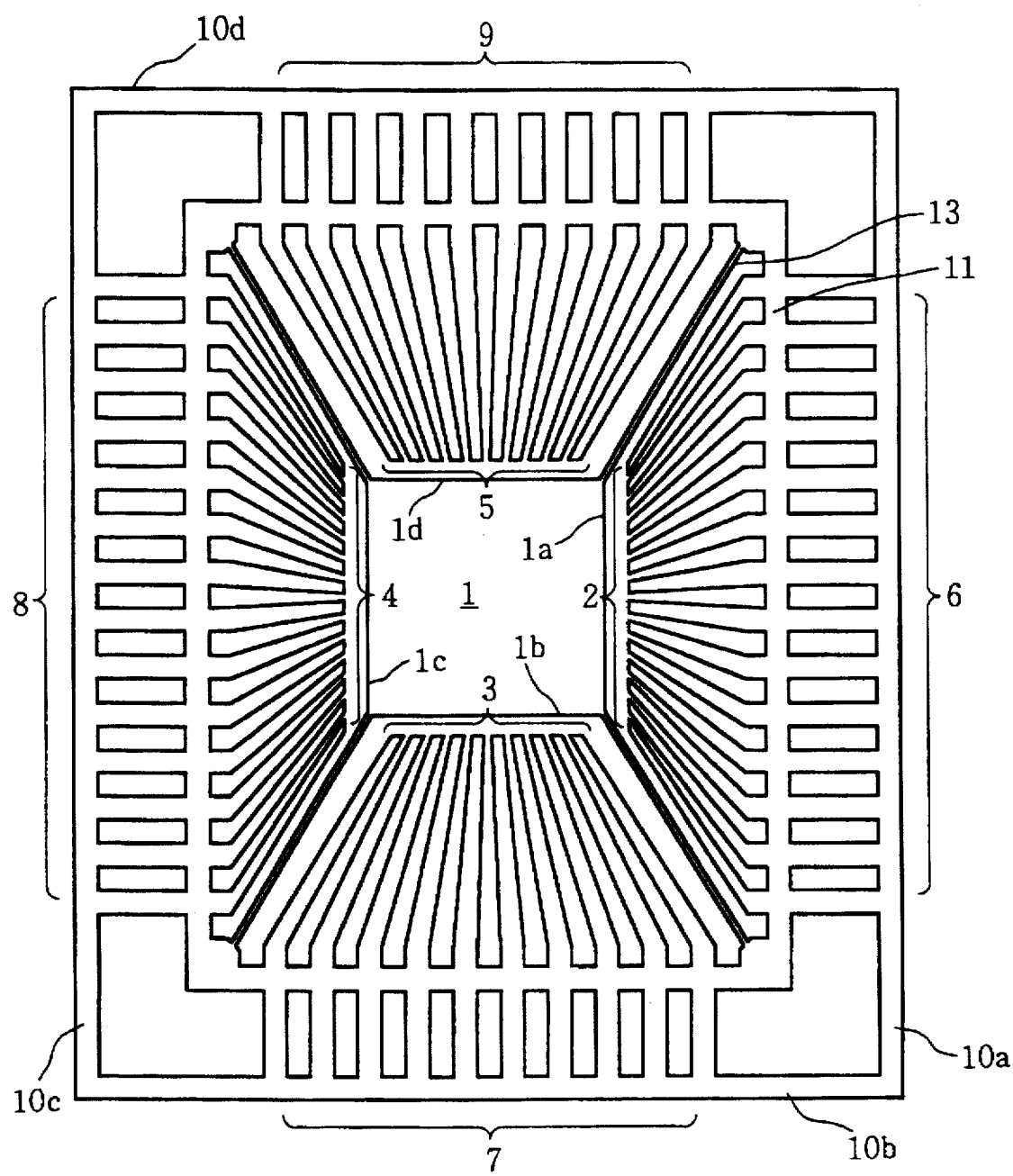
FIG. 13 is a plane view for showing the configuration of a conventional lead frame.
Figure 14A:
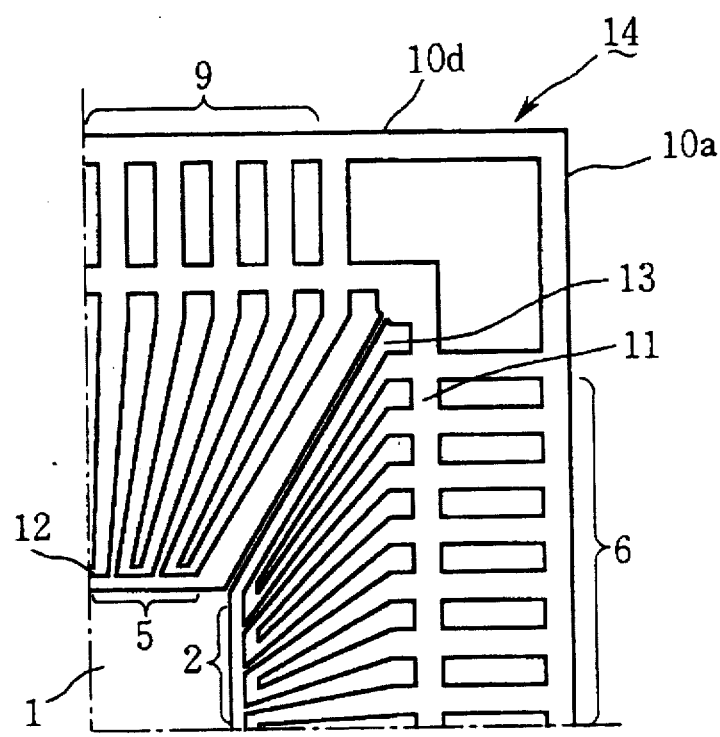
FIGS. 14(a) and 14(b) are partial plane views for showing production procedures for the conventional lead frame.
Figure 14B:
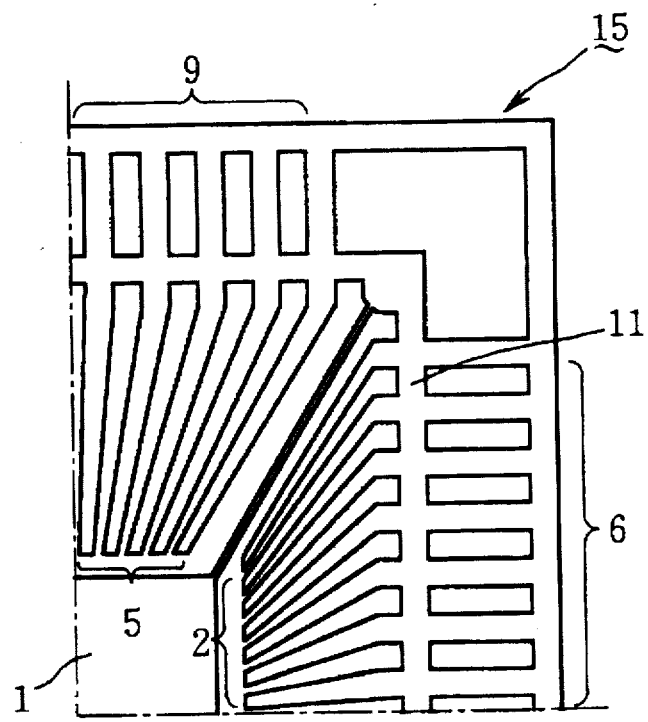
Figure 15:
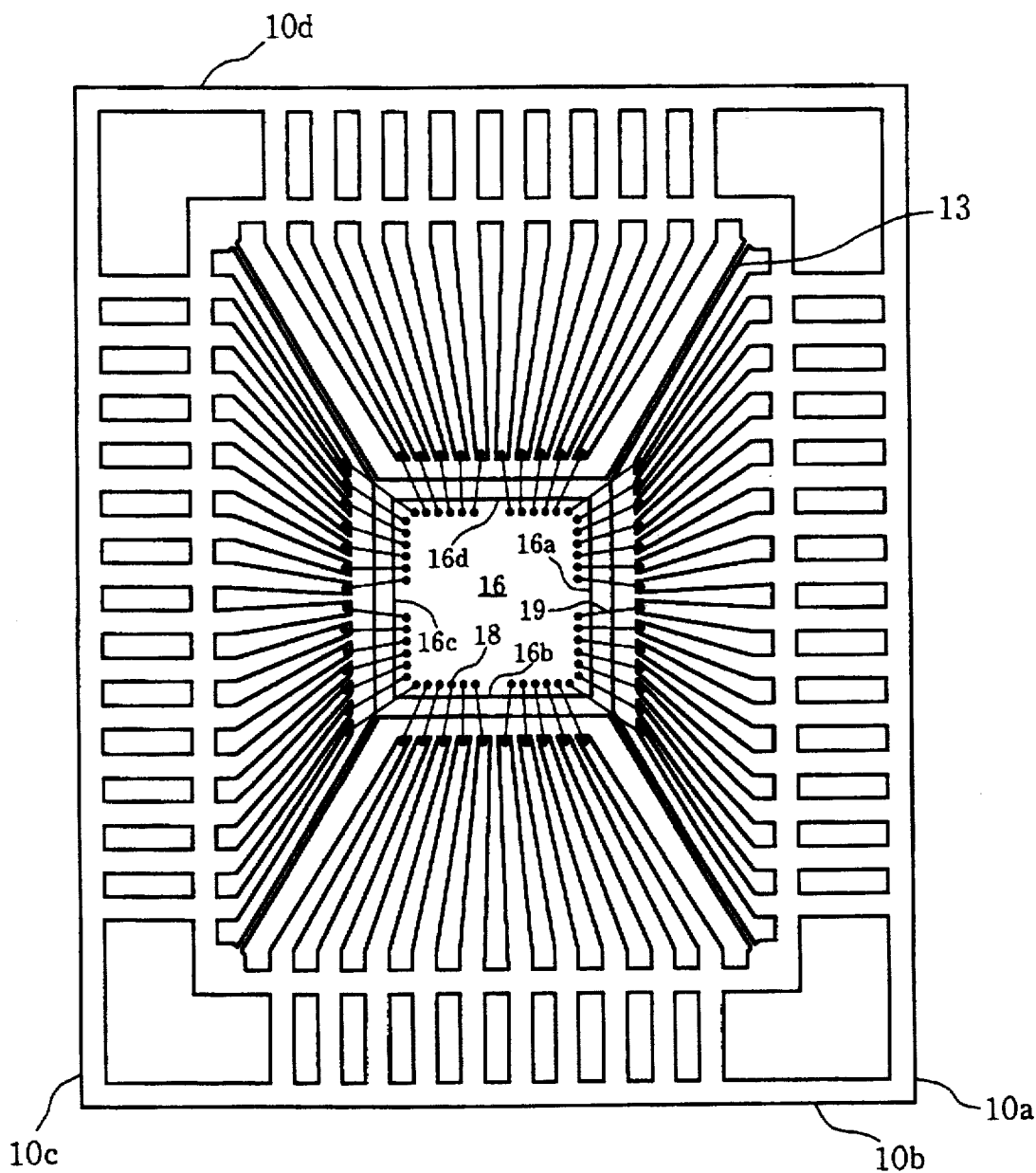
FIG. 15 is a plane view for showing the conventional lead frame mounting a semiconductor chip.

In the lead frame of this embodiment, differently from the conventional lead frame in which the die pad 20 for mounting the semiconductor chip is supported by the die pad leads, the die pad 20 is supported by connecting the support members 30 provided to the die pad 20 with the inner lead groups 21 through 24 via the insulating member 31. This results in the following effects:

First, the die pad leads 13 which are conventionally required as is shown in FIG. 13 can be omitted. Since the die pad lead which makes no contribution to electrical connection is interposed between the dam bar 29 and the die pad 20 in the conventional lead frame, the space Spc corresponding to the position of the die pad lead cannot be used for wiring. In contrast, although the configuration of this embodiment includes the support member 30, the tip of the support member 30 does not reach the dam bar 29, and hence, a space between the tip and the dam bar 29 can be used for wiring. In addition, since the support member 30 is connected with the inner lead groups 21 through 24 via the insulating member 31, the effect of the outer frame 50a through 50d to support the die pad 20 is not spoiled. Therefore, while the die pad 20 is securely supported by the outer frames 50a through 50 d, the die pad leads conventionally connecting the corners of the die pad and the corners of the dam bar is eliminated. As a result, the electrical connection such as wiring between the semiconductor chip and the inner leads can be stabilized and the wiring efficiency can be improved. Additionally, the elimination of the die pad leads results in room for the alignment of the inner leads. Therefore, even when the number of the inner leads increases as a result of the increase of the number of pins (i.e., when a multi-pin chip is used), the inner leads can be appropriately led. Furthermore, since the pitch between the inner leads can be avoided from becoming too small, troubles such as a short-circuit between the bonding wires can be avoided.

In particular, when the support member 30 is disposed so as to extend toward the corner of the dam bar 29 as in this embodiment, the support member 30 is not required to reach the dam bar 29 but can extend to a point connectable to the inner leads. Accordingly, it is possible, for example, to enlarge the pitch between the inner leads by gradually shifting the inner leads toward the corner, or to dispose some of the inner leads within the space Spc. Thus, there is no restriction in the lead-in (alignment) of the inner leads of the respective inner lead groups.

Secondly, by providing the space Spc between the support member 30 and the dam bar 29, the resin, which is allowed to flow from a gate 33 in the direction shown with an arrow A in FIG. 2 in the resin injection, is prevented from meeting with resistance by the conventionally used die pad lead. Accordingly, it is possible to prevent cells from being formed in the resin so that a resin sealed semiconductor device having few voids can be manufactured.

Thirdly, when the die pad lead extending between the corner of the dam bar 29 and the corner of the die pad 20 is disposed as in the conventional lead frame, the resultant resin sealed semiconductor device is likely to have a package crack because water and moisture tend to enter through the corner along the die pad lead. In contrast, in the configuration of this embodiment, the space Spc between the tip of the support member 30 and the corner of the dam bar 29 is sealed with the resin, so that water and moisture are prevented from entering through the corner. Thus, the reliability of the resin sealed semiconductor device can be improved.

The surface of the lead frame of this embodiment is, if necessary, appropriately plated. The metal material used for plating can be properly selected from iron (Fe) type materials, copper (Cu) type materials and titanium (Ti) type materials. When the lead frame is thus plated, the adhesion to the sealing resin can be advantageously improved.

(Embodiment 2)

The second embodiment will now be described referring to the drawings.

Figure 3:
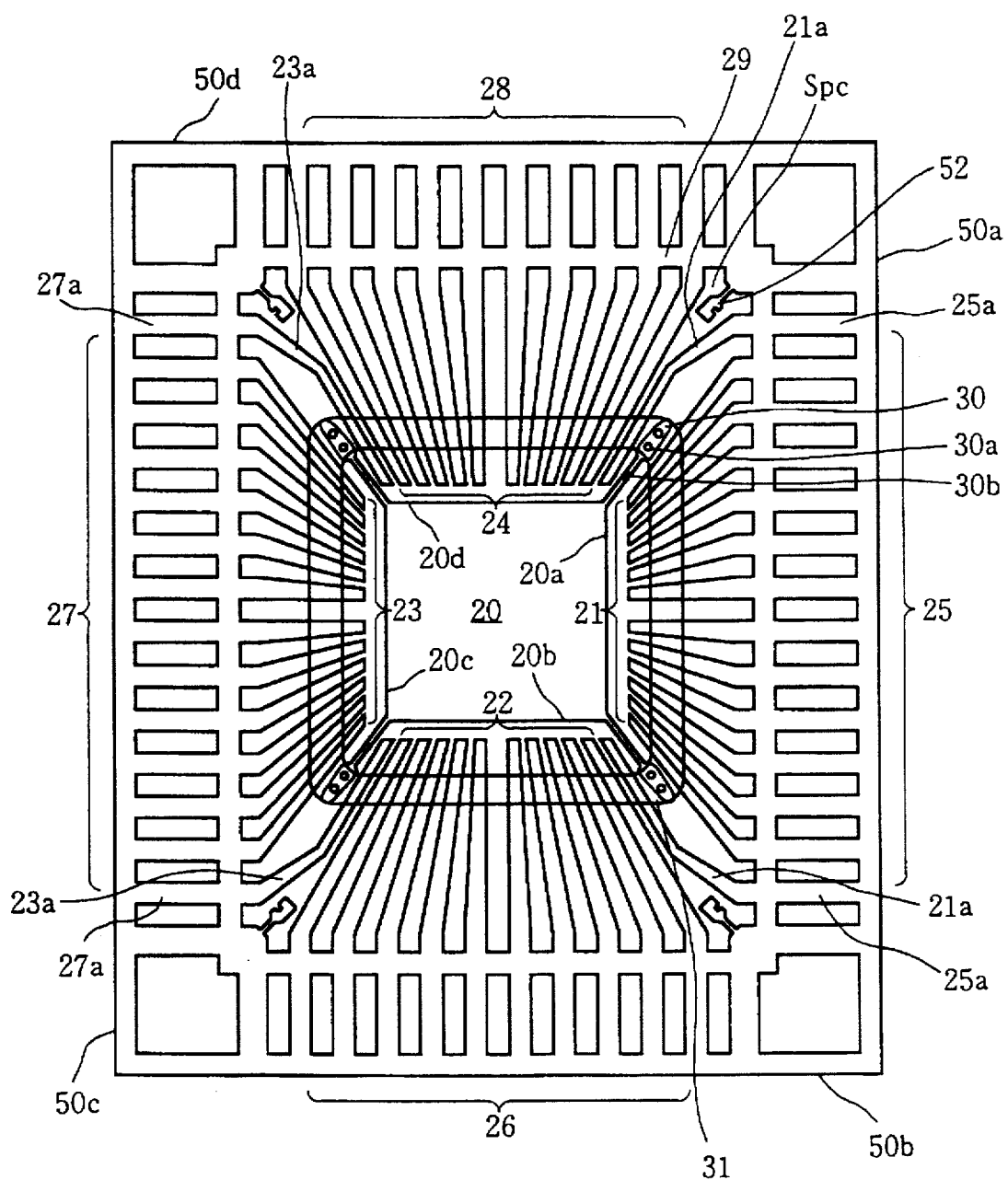
FIG. 3 is a plane view of a lead frame according to a second embodiment of the invention.

FIG. 3 is a plane view of a lead frame of this embodiment. As is shown in FIG. 3, the lead frame of this embodiment is a lead frame to be used in a QFP type resin sealed semiconductor device similarly to the first embodiment. The lead frame is also similar to that of the first embodiment in comprising outer frames 50a through 50d, a die pad 20, inner lead groups 21 through 24, outer lead groups 25 through 28, a dam bar 29, support members 30, an insulating member 31 and the like. Also similarly to the first embodiment, the tips of the inner lead groups 21 through 24 are arranged so as to form a virtual rectangular pattern (substantially a square in this embodiment) having four sides respectively parallel to the first through fourth outer frames 50a through 50d.

This embodiment is characterized in that at least one inner lead of each of the first and third inner lead groups 21 and 23 (corresponding to inner leads 21a and 23a at both ends of these inner lead groups in this embodiment) is branched from the other inner leads belonging to the same group, so as to cross a space Spc between the support member 30 and the corner of the dam bar 29 and extend to an area where the tips of the inner leads of the second or fourth inner lead group 22 or 24 are aligned. In other words, the branched inner leads 21a and 23a are connected with the longer outer frames 50a and 50c, respectively via the outer leads at their bottoms but their tips are aligned along the sides of the virtual rectangular pattern adjacent to the sides corresponding to the longer outer frames 50a and 50c, respectively. In this manner, the tips of the inner leads 21a and 23a are located so as to oppose the electrodes of a semiconductor chip to be formed along these sides.

Figure 4:
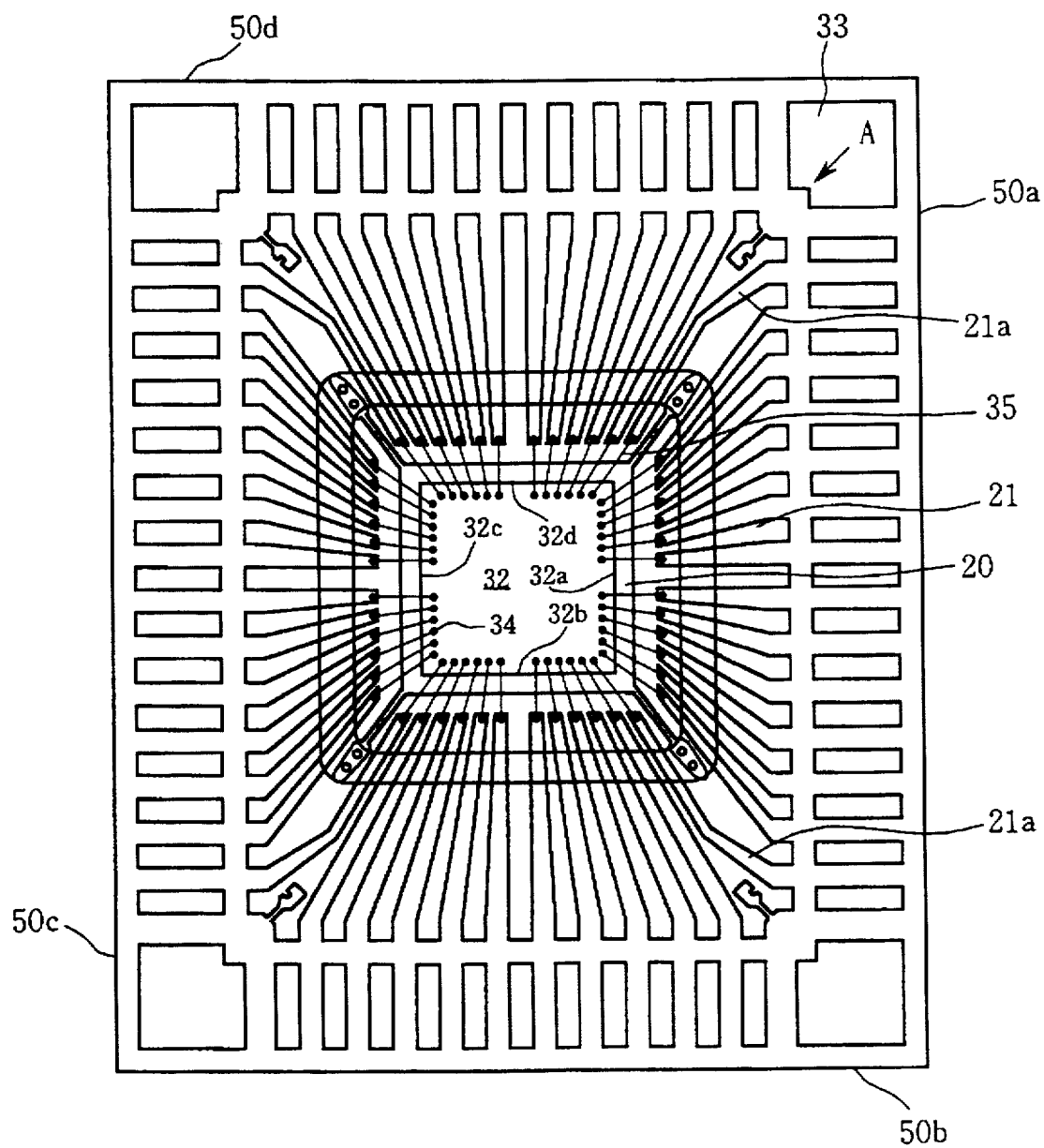
FIG. 4 is a plane view of the lead frame of the second embodiment mounting a semiconductor chip.

FIG. 4 is a plane view of the state of the lead frame after mounting a semiconductor chip 32 on the die pad 20 and before conducting resin injection for manufacturing a resin sealed semiconductor device. As is shown in FIG. 4, the branched inner leads 21a and 23a belonging to the first and third inner lead groups 21 and 23 are respectively connected with electrodes 34 disposed along second and fourth sides 32b and 32d of the semiconductor chip 32 similarly to the first embodiment. However, differently from the first embodiment, metal wires 35 for connecting the branched inner leads 21a and 23a with the electrodes 34 of the semiconductor chip 32 do not cross the diagonals of the semiconductor chip 32. Such configuration can be attained by disposing the tips of the branched inner leads 21a and 23a so as to oppose the second and fourth sides 32b and 32d of the semiconductor chip 32.

Accordingly, this embodiment can particularly achieve, in addition to the similar effects to those of the first embodiment, the following effects: In the case where the first and third outer frames 50a and 50c are longer than the second and fourth outer frames 50b and 50c as in this embodiment, the pitch between the leads can be made uniform by connecting a larger number of leads with the former outer frames than with the latter outer frames. However, when the shape of the semiconductor chip is substantially a square, it is preferred that the same number of bonding pads are provided on the respective sides of the semiconductor chip in view of a uniform pitch between the electrodes. Even when the semiconductor chip has a larger capacity and a larger number of pins, the size of the semiconductor chip cannot exceed the standard. Therefore, the pitches between the leads and between the electrodes have become smaller and smaller, and there are increasing demands for a configuration having small pitches. Accordingly, when all the inner leads of the inner lead groups 21 and 23 connected with the longer first and third outer frames 50a and 50c are disposed so as to oppose the first and third sides 32a and 32c of the semiconductor chip 32 which are parallel to the first and third outer frames 50a and 50c as in the first embodiment, it is necessary to extend the metal wires (bonding wires) 35 between the end inner leads and the electrodes along the second and fourth sides 32b and 32d so as to cross the diagonals of the semiconductor chip 32. When the metal wires 35 are disposed across the diagonals in this manner, a resin that is injected in the diagonal direction (i.e., in the direction shown with an arrow A in FIG. 4) in the resin injection can apply a large force to the metal wires 35 and the leads, so that disconnection and a short-circuit can be caused. In contrast, since the metal wires 85 connected with the end branched inner leads 21a and 23a of the first and third inner lead groups 21 and 23 do not cross the diagonals of the semiconductor chip 32 in this embodiment, the aforementioned problems can be avoided. Specifically, in this embodiment, even when not only the pitch between the leads but also the pitch between the electrodes of the semiconductor chip are made uniform, the disconnection and short-circuit of the metal wires 35 can be effectively prevented. Thus, inner leads can be appropriately led in accordance with the number of the bonding pads of a semiconductor chip in a resin sealed semiconductor device which has been developed to have a large number of pins and a smaller pitch. Accordingly, this embodiment can successfully ease the production of and improve the reliability of a resin sealed semiconductor device with a large number of pins and a small pitch.

The inner lead groups 21 through 24 can be arranged in this manner by eliminating the conventionally used die pad leads which are not used for electrical connection. The space conventionally occupied by the die pad lead between the tip of the support member and the dam bar 29, that is, the space Spc along the diagonal between the corners of the die pad 20 and the dam bar 29 in this embodiment, can be efficiently used for wiring the leads.

The branched inner leads 21a and 23a are shown as one lead at each end of the inner lead groups in FIGS. 3 and 4, but the number of the branched inner leads is not limited to one at each end. It is possible to branch a plurality of inner leads in view of the total number and the arrangement of the inner leads.

In each of the first and second embodiments, the lead frame is exemplified as a lead frame to be used in the QFP type resin sealed semiconductor device in which the lead frame is substantially in the shape of a rectangle and the die pad 20 is substantially in the shape of a square as shown in the referred drawings. However, the invention is not limited to these shapes, but the configurations described in these embodiments can achieve the same functions and effects in a lead frame substantially having the shape of a square and including a die pad substantially in the shape of a rectangle.

(Embodiment 3)

Figure 5:
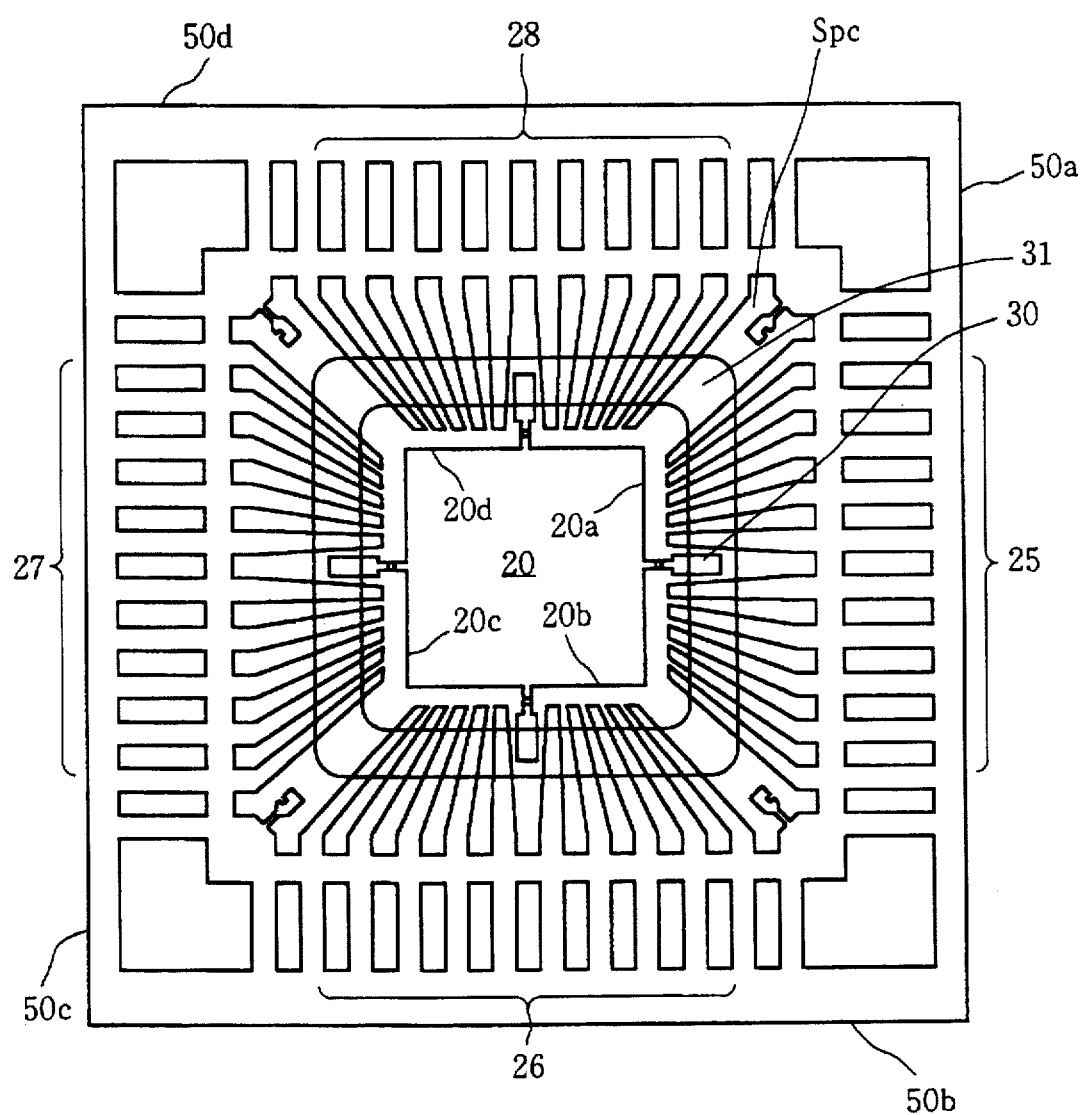
FIG. 5 is a plane view of a lead frame according to a third embodiment of the invention.

FIG. 5 is a plane view of a lead frame according to the third embodiment. As is shown in FIG. 5, this lead frame comprises support members 30 disposed substantially at the centers of respective sides 20a through 20d of a die pad 20. Except for the support members 30, this lead frame has a similar configuration to that of the first embodiment.

Similarly to the first embodiment, this embodiment can achieve the fundamental effect that the support members 30 can be freely disposed in view of the number of and the pitch between the inner leads. In particular in this embodiment, a space Spc along the diagonal between the corners of the die pad 20 and a dam bar 29 is largely increased, and hence, the space Spc along the diagonal can be more effectively utilized.

(Embodiment 4)

Figure 6:
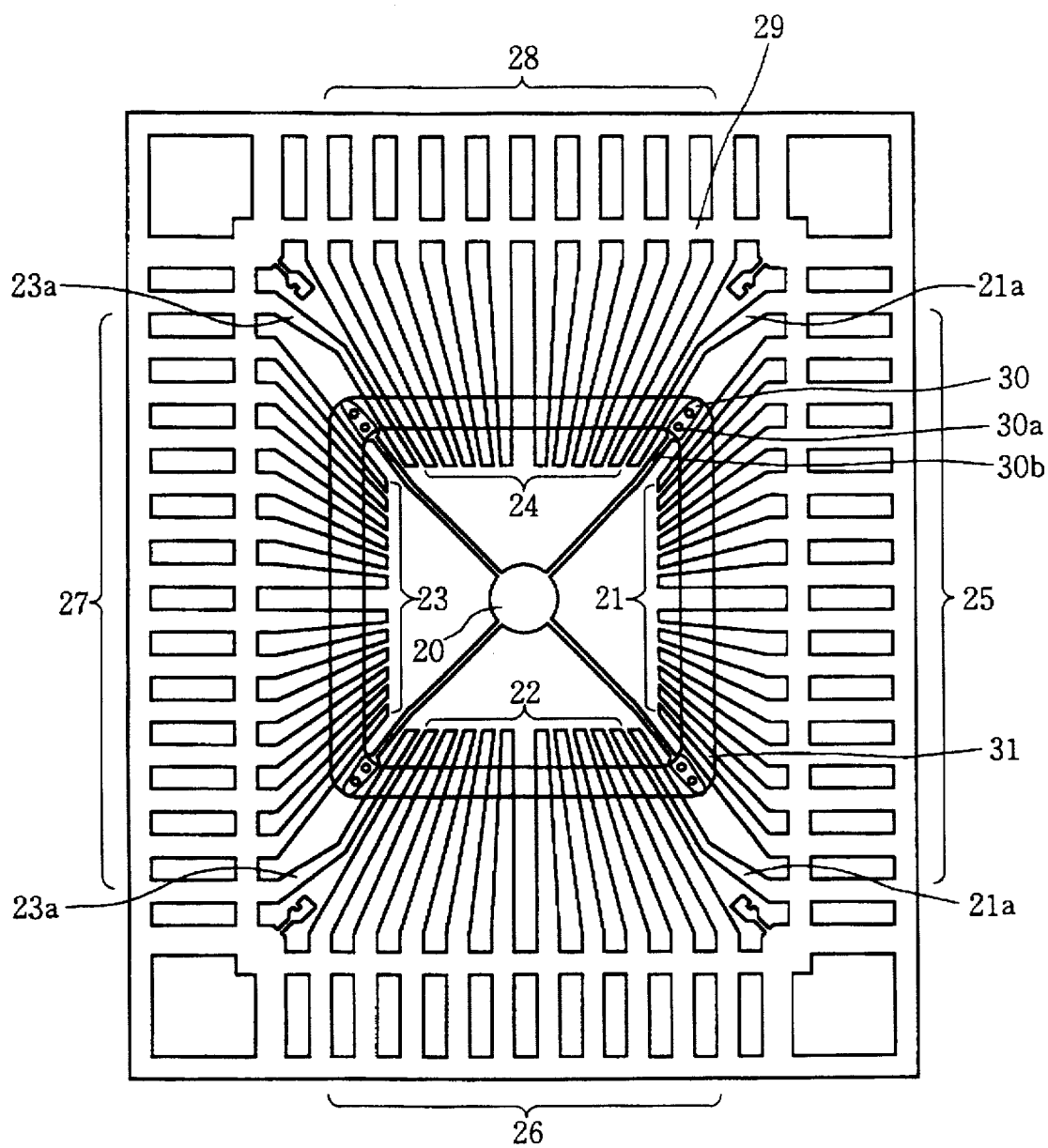
FIG. 6 is a plane view of a lead frame according to a fourth embodiment of the invention.

FIG. 6 is a plane view of a lead frame according to the fourth embodiment. As is shown in FIG. 6, the lead frame of this embodiment has substantially the same configuration as that of the second embodiment, and description of the commonly used elements is omitted. This embodiment is characterized in that the die pad 20 for mounting a semiconductor chip is in the shape of not a square but substantially a circle and has a smaller size than that of the semiconductor chip to be mounted thereon. The die pad 20 is disposed at the center of a space surrounded by the outer frames 50a through 50d so as to support the semiconductor chip at the center of the lead frame. In addition, the support members 30 extend from the outer peripheral portion of the die pad 20 toward the corners of the dam bar 29 with the tips of the support members 30 located at the same positions as those of the support members 30 of the second embodiment. Also similarly to the second embodiment, the inner lead groups 21 through 24 and the support members 30 are commonly connected with one another via the square ring-shaped insulating member 31, and the tips of the branched inner leads 21a and 23a of the first and third inner lead groups 21 and 23 are aligned in the areas where the tips of the adjacent second and fourth inner lead groups 22 and 24 are positioned, that is, along the sides of the virtual rectangular pattern which are not parallel to the outer frames 50a and 50c with which the inner leads 21a and 23a are connected.

The configuration of the lead frame of this embodiment can achieve the same effects as those of the second embodiment.

Additionally, the configuration of this embodiment can effectively prevent occurrence of a package crack of a resultant semiconductor device manufactured by mounting a semiconductor chip on the die pad 20 and sealing the lead frame with a resin for the following reasons: First, since the materials for the semiconductor chip and the lead frame are different in the coefficient of thermal expansion, a package crack can be caused due to thermal stress when the semiconductor device is exposed to a high temperature in a reflow process for packaging the semiconductor device on a print substrate or the like. However, when the configuration of the lead frame of this embodiment is adopted, the thermal stress can be decreased to as small as possible because the size of the die pad 20 is very small. Secondly, in a sealing process after mounting the semiconductor chip on the die pad 20 for sealing the lead frame with a resin so as to manufacture a sealed semiconductor device, the flowability of the resin on the back surface of the die pad 20 is improved in this embodiment, so as to prevent occurrence of a resin void which can cause a package crack. Thirdly, similarly to the first embodiment, water and moisture can be prevented from entering through the corners in this embodiment. In this manner, the reliability of the semiconductor device can be largely improved in this embodiment by utilizing the die pad 20 with a small size.

(Embodiment 5)

Figure 7:
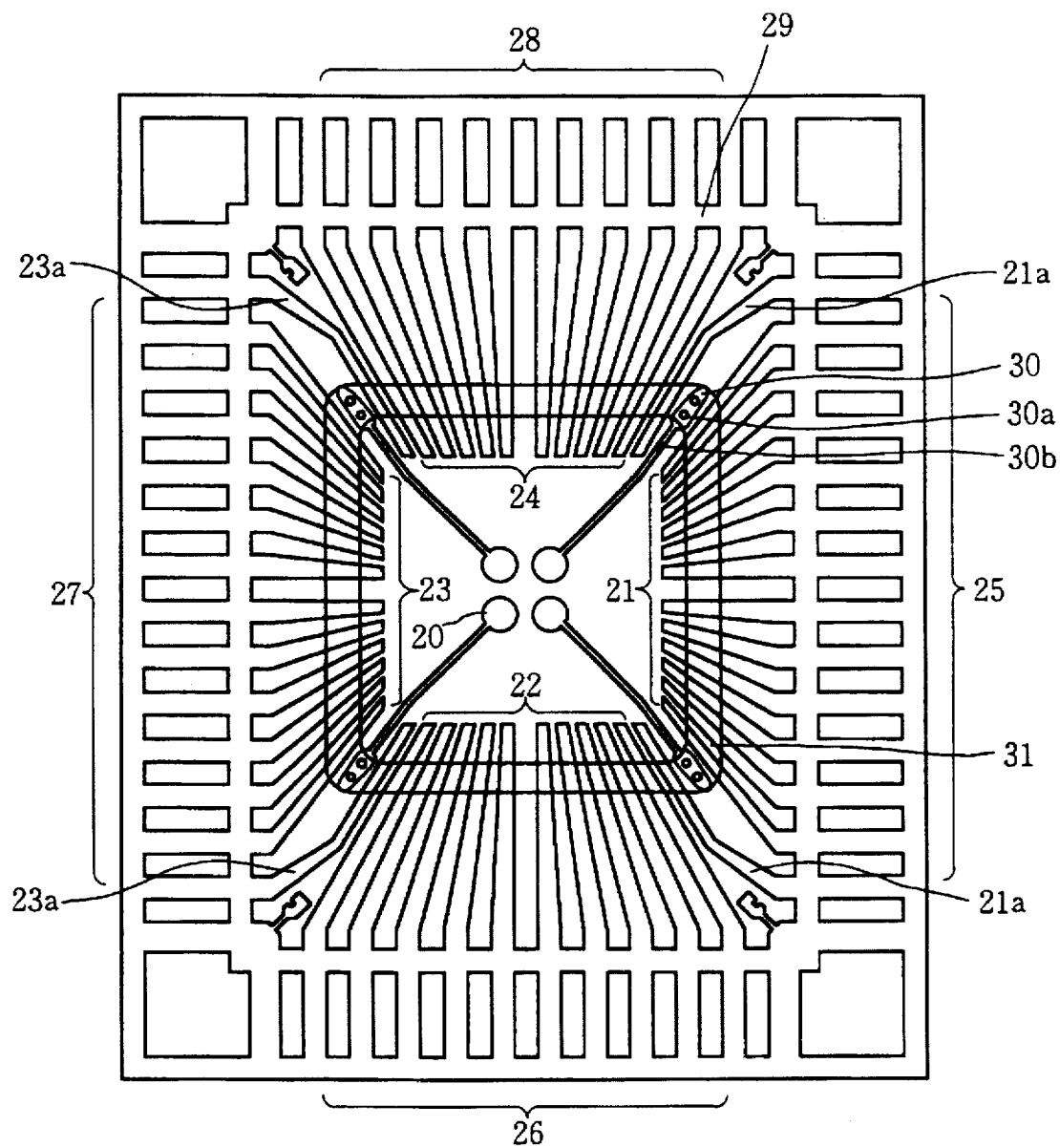
FIG. 7 is a plane view of a lead frame according to a fifth embodiment of the invention.

FIG. 7 is a plane view of a lead frame according to the fifth embodiment. The lead frame of this embodiment has substantially the same configuration as the lead frame of the fourth embodiment except that a die pad 20 of this embodiment is divided into four portions each of which is substantially in the shape of a circle. Each portion of the die pad 20 is provided with the support member 30. In other words, the die pad 20 is divided in accordance with the number of the support members 30. The remaining configuration is the same as that of the fourth embodiment.

When the configuration of the lead frame of this embodiment is adopted, the same effects as those of the fourth embodiment can be attained, and the occurrence of a package crack can be prevented. In addition, since the die pad 20 of this embodiment is divided in accordance with the number of the support members 30, tensile stress, which is caused in the support members 30 and the die pad 20 in the press working for forming the depress portion 30b on each support member 30, can be decreased. Accordingly, it is possible to prevent the lead frame from being deformed by the tensile stress, resulting in further improving the reliability of the resultant semiconductor device.

(Embodiment 6)

The sixth embodiment regarding a production method for a lead frame will now be described referring to the accompanying drawings.

Figure 8A:
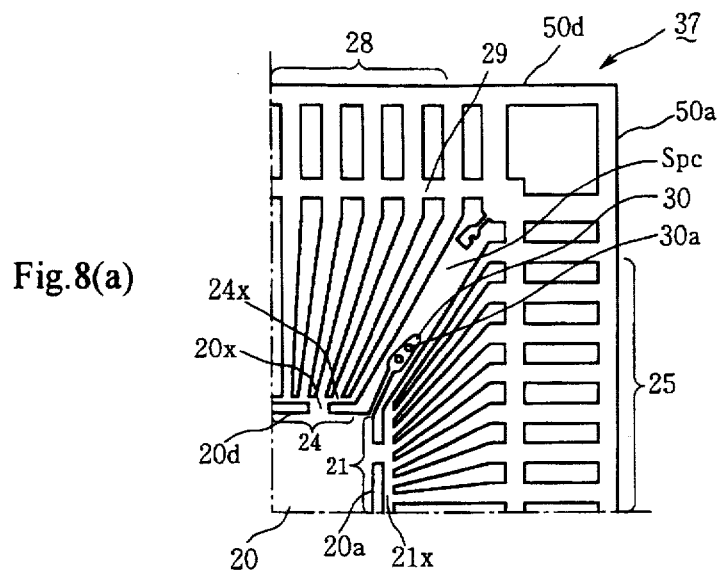
FIGS. 8(a) through 8(c) are partial plane views for showing production procedures for the lead frame according to a sixth embodiment of the invention.
Figure 8B:
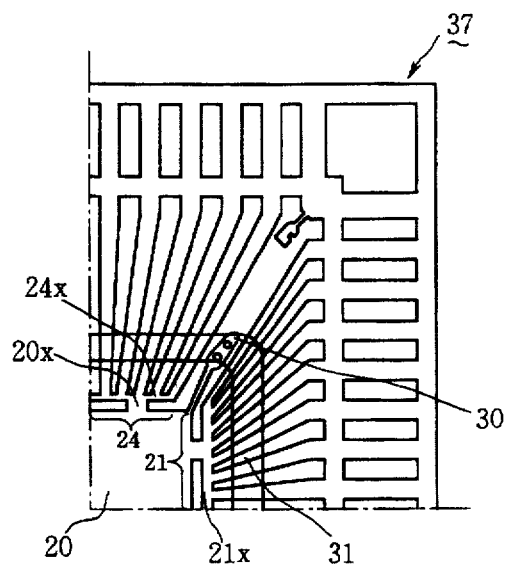
Figure 8C:
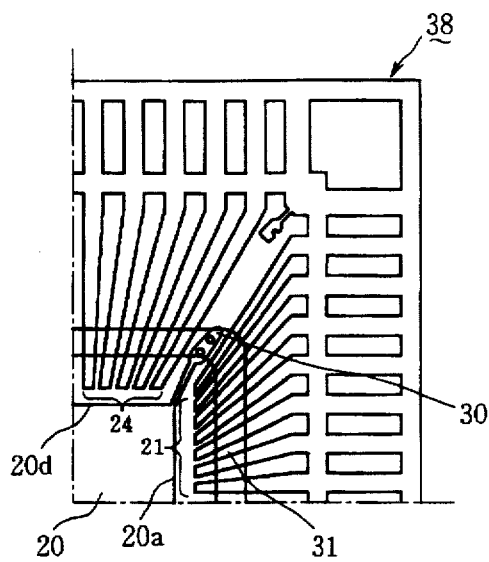

FIGS. 8(a) through 8(c) are plane views for showing an exemplified production method for realizing the configuration of the lead frame of the first embodiment, wherein merely a quarter portion of the lead frame is shown for convenience.

First, as is shown in FIG. 8(a), as a first step, a metal plate as a base of the lead frame is made into a pattern by etching or the like, thereby fabricating a first lead frame body 37 comprising the four outer frames 50a through 50d (among which the second and third outer frames 50b and 50c are not shown) in the form of a rectangle, the first through fourth outer lead groups 25 through 28 (among which the second and third outer lead groups 26 and 27 are not shown) respectively connected with the outer frames 50a through 50d at their bottoms, the die pad 20 in the shape of a square having at least the first through fourth sides 20a through 20d (among which the second and third sides 20b and 20c are not shown), the support members 30 connected with the respective corners of the die pad 20, the first through fourth inner lead groups 21 through 24 (among which the second and third inner lead groups 22 and 23 are not shown) respectively connected with the outer lead groups 25 through 28 at their bottoms and connected with the die pad 20 via tip connection areas 21x through 24x and a connection area 20x so as to support the die pad 20, and the dam bar 29 for binding the outer leads of the outer lead groups 25 through 28 to one another. In the formation of the support members 30 connected with the die pad 20 in this step, each support member 30 is formed so as to have a larger width at its tip, where the through hole 30a for attaining the anchor function is formed.

The support members 30 can be appropriately formed at an optional position in addition to the corners of the die pad 20, so that the efficiency in the alignment of the inner lead groups 21 through 24 can be maximized.

After forming the first lead frame body 37 in the first step, the lead frame body is plated with a metal material having satisfactory adhesion to a sealing resin. This plating process is conducted for the purpose of improving the adhesion to the sealing resin and the like.

Next, as is shown in FIG. 8(b), as a second step, the support members 30 are connected with the inner lead groups 21 through 24 via the insulating member 31. As is shown in FIG. 8(b), the respective support members 30 are connected with the inner lead groups 21 through 24 by using one and common insulating member in this embodiment. The insulating member 31 is made of a material having an insulating property and an adhesive strength such as polyimide and silicon rubber. For the connection, the insulating member 31 which has been previously made into the shape of a tape is used to connect the support members 30 and the inner lead groups 21 through 24, or a liquid adhesive resin such as a polyimide resin is applied between the support members 30 and the inner lead groups 21 through 24 in the shape of a ring so as to connect them with one another. The insulating member 31 is formed at a position excluding the areas where the inner leads are wired to one another. In this embodiment, the insulating member 31 is provided on the front surface of the lead frame.

Then, as is shown in FIG. 8(c), as a third step, the tip connection areas 21x through 24x provided on the die pad 20 and the tips of the inner lead groups 21 through 24 are removed by punching or the like from the lead frame body having the insulating member 31. Through this procedure, the respective inner leads are separated from one another at the tips of the inner lead groups 21 through 24, and the die pad 20 separated from the inner lead groups 21 through 24. Thus, a second lead frame body 38 is fabricated. In this manner, the inner lead groups 21 through 24 having supported the die pad 20 are separated from the die pad 20, and the tips of the respective inner leads of the inner lead groups 21 through 24 are thus extended to the vicinity of the sides 20a through 20d of the die pad 20. The die pad 20 is thus supported by the inner lead groups 21 through 24 via the support members 30 and the insulating member 31 alone.

In the production method for the lead frame of this embodiment, the support members 30 connected with the die pad 20 and the inner lead groups 21 through 24 are connected and bound by the insulating member 31 in the second step. Therefore, when the die pad 20 is separated from the inner lead groups 21 through 24 in the third step, the die pad 20 can be supported by the inner lead groups 21 through 24 via the insulating member 31 and the support members 30. Therefore, the die pad 20 is prevented from dropping and can be securely supported. Thus, there arises no problem in the production procedures in manufacturing the lead frame having no die pad lead.

(Embodiment 7)

The seventh embodiment regarding the production method for a semiconductor device will now be described referring to the accompanying drawings.

Figure 9A:
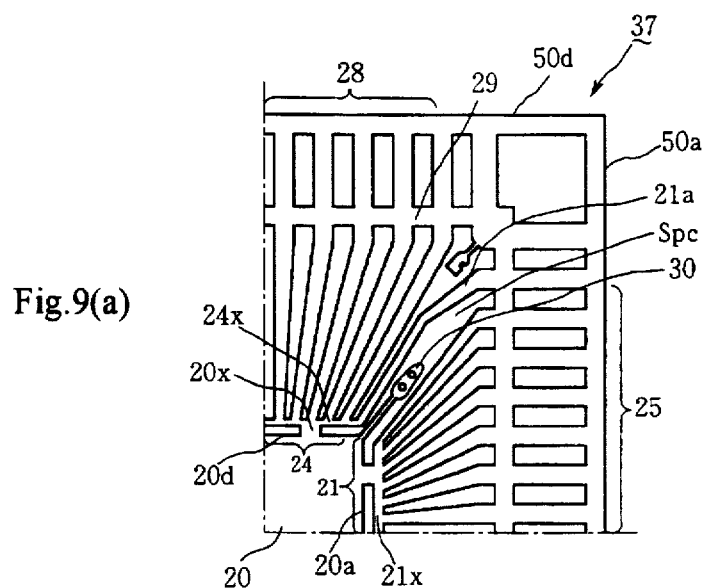
FIGS. 9(a) through 9(c) are partial plane views for showing production procedures for the lead frame according to a seventh embodiment of the invention.
Figure 9B:
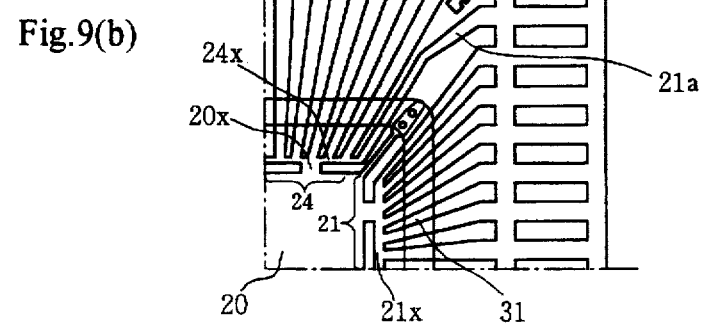
Figure 9C:
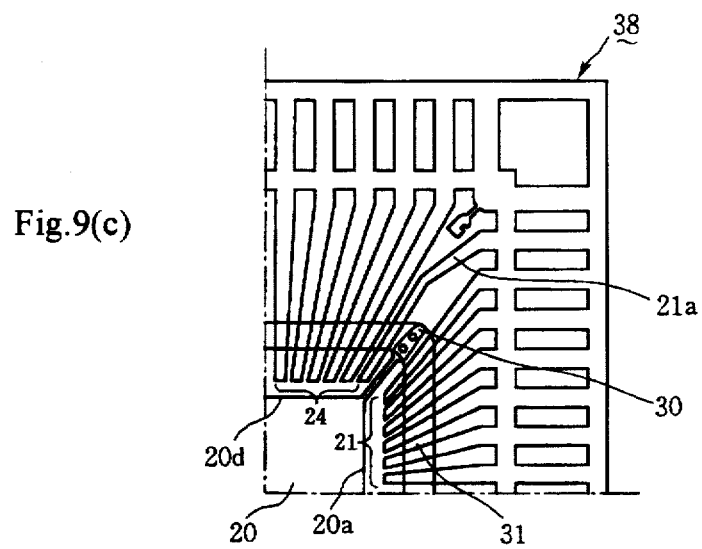

FIGS. 9(a) through 9(c) are plane view for showing an exemplified production method for realizing the lead frame of the second embodiment, wherein merely a quarter portion of the lead frame is shown for convenience.

First, as is shown in FIG. 9(a), as a first step, similarly to the sixth embodiment, a metal plate as a base of the lead frame is made into a pattern by etching or the like, thereby fabricating a first lead frame body 37 comprising the four outer frames 50a through 50d (among which the second and third outer frames 50b and 50c are not shown) in the form of a rectangle, the first through fourth outer lead groups 25 through 28 (among which the second and third outer lead groups 26 and 27 are not shown) respectively connected with the outer frames 50a through 50d at their bottoms, the die pad 20 in the shape of a square having at least the first through fourth sides 20a through 20d (among which the second and third sides 20b and 20c are not shown), the support members 30 connected with the corners of the die pad 20, the first through fourth inner lead groups 21 through 24 (among which the second and third inner lead groups 22 and 23 are not shown) respectively connected with the outer lead groups 25 through 28 at their bottoms and connected with the die pad 20 via tip connection areas 21x through 24x and a connection area 20x so as to support the die pad 20, and the dam bar 29 for binding the outer leads of the outer lead groups 25 through 28. In the formation of the support members 30 connected with the die pad 20 in this step, each support member 30 is formed so as to have a larger width at its tip, where the through hole 30a for attaining the anchor function is formed.

However, in this embodiment, differently from the sixth embodiment, the tips of the branched inner leads 21a and 23a at both ends of the first and third inner lead groups 21 and 23 are connected with the tip connection areas 22x and 24x formed at the tips of the second and fourth inner lead groups 22 and 24 (among which the tip connection area 22x is not shown).

Next, as is shown in FIG. 9(b), as a second step, the support members 30 and the inner lead groups 21 through 24 are connected via the insulating member 31. As is shown in FIG. 9(b), the support members 30 and the inner lead groups 21 through 24 (including the branched inner leads 21a and 23a, among which the branched leads 23a are not shown) are connected by using one and common insulating member in this embodiment. The insulating member 31 is made of a material having an insulating property and an adhesive strength such as polyimide and silicon rubber. For the connection, the insulating member 31 having been previously formed into the shape of a tape is used to connect the support members 30 and the inner lead groups 21 through 24 (including the branched inner leads 21a and 23a), or a liquid adhesive resin such as a polyimide resin is applied between the supporting members 30 and the inner lead groups 21 through 24 in the shape of a ring so as to connect them with one another. The insulating member 31 is formed at a position excluding the areas where the inner leads are wired to one another.

In the production method of this embodiment, the support members 30 and the inner lead groups 21 through 24 are connected by using one and common insulating member 81. However, for example, the support members 80 extending from the die pad 20 can be partially connected with the branched inner leads 21a and 23a, so as to support the die pad 20. In this embodiment, the insulating member 81 is provided on the front surface of the lead frame.

Then, as is shown in FIG. 9(c), as a third step, the tip connection areas 21x through 24x provided on the die pad 20 and the tips of the inner lead groups 21 through 24 and the branched inner leads 21a and 23a are cut off by punching or the like from the lead frame body having the insulating member 31. Through this procedure, the respective inner leads are separated from one another at the tips of the inner lead groups 21 through 24, and the die pad 20 is separated from the inner lead groups 21 through 24. Thus, a second lead frame body 38 is fabricated. In this manner, the inner leads having 20 supported the die pad 20 are separated from the die pad 20, and the tips of the inner leads are thus extended to the vicinity of the sides 20a through 20d of the die pad 20 (i.e., the vicinity of the electrodes of the semiconductor chip) in a plane view. Thus, the die pad 20 is supported by the inner lead groups 21 through 24 and the branched inner leads 21a and 23a via the support members 30 and the insulating member 31 alone.

(Embodiment 8)

The eighth embodiment regarding the production method for a semiconductor device will now be described referring to the accompanying drawings.

Figure 10A:
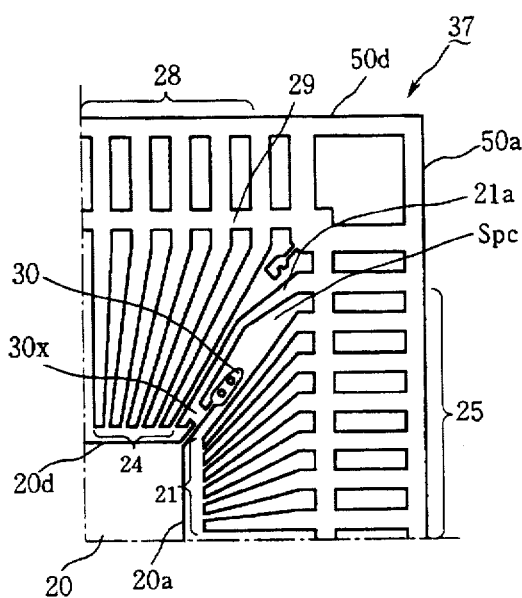
FIGS. 10(a) through 10(c) are partial plane views for showing production procedures for the lead frame according to an eighth embodiment of the invention.
Figure 10B:
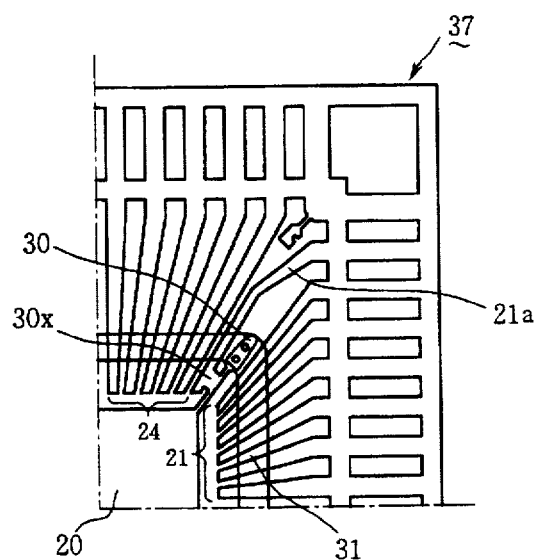
Figure 10C:
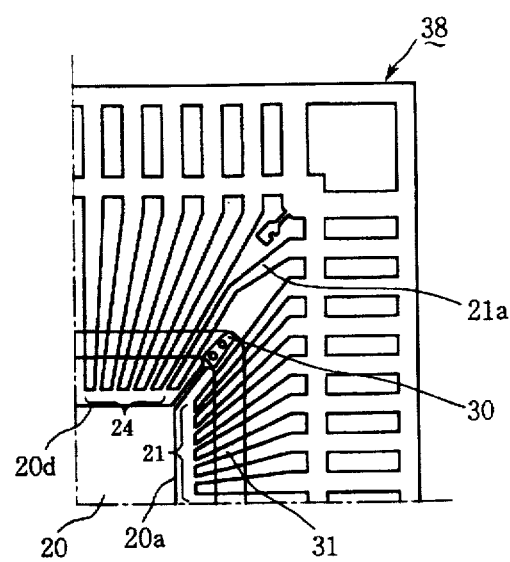

FIG. 10(a) through 10(c) are plane views for showing another exemplified method for realizing the lead frame of the second embodiment, in which merely a quarter portion of the lead frame is shown for convenience.

First, as is shown in FIG. 10(a), as a first step, a metal plate as a base of the lead frame is made into a pattern by etching or the like, thereby fabricating a first lead frame body 37 comprising the four outer frames 50a through 50d (among which the second and third outer frames 50b and 50c are not shown) in the shape of a rectangle, the first through fourth outer lead groups 25 through 28 (among which the second and third outer lead groups 26 and 27 are not shown) respectively connected with the outer frames 50a through 50d at their bottoms, the die pad 20 in the shape of a square having at least the first through fourth sides 20a through 20d (among which the second and third sides 20b and 20c are not shown), the support members 30 connected with the corners of the die pad 20, the first through fourth inner lead groups 21 through 24 (among which the second and third inner lead groups 22 and 23 are not shown) respectively connected with the outer lead groups 25 through 28 at their bottoms and extending to the vicinity of the first through fourth sides 20a through 20d of the die pad 20 (i.e., the vicinity of the electrodes of the semiconductor chip), and the dam bar 29 for binding the outer leads of the outer lead groups 25 through 28. In the formation of the support members 30 connected with the die pad 20 in this step, each support member 30 is formed so as to have a larger width at its tip, where the through hole 30a for attaining the anchor function is formed.

This embodiment is characterized in that, in the first lead frame body 37 fabricated in the first step of this embodiment, no connection area is formed at the tips of the inner lead groups 21 through 24, and the respective inner leads are independent from one another, differently from the seventh embodiment. The branched inner leads 21a and 23a at the both ends of the first and third inner lead groups 21 and 23 are disposed across the spaces Spc between the tips of the support members 30 and the corners of the dam bar 29, with their tips aligned along the sides of the virtual rectangular pattern formed by the tips of the inner leads which are not parallel to the first and third longer outer frames 50a and 50c with which the branched inner leads 21a and 23a are connected (among which one of the branched inner leads 21a alone is shown and the branched inner leads 23a are not shown). The support members 30 are connected with the branched inner leads 21a and 23a via connection areas 30x, and the die pad 20 is supported by the branched inner leads 21a and 23a.

Next, as is shown in FIG. 10(b), as a second step, the support members 30 and the inner lead groups 21 through 24 are connected via the insulating member 31. As is shown in FIG. 10(b), the support members 30 are connected with the inner lead groups 21 through 24 and the branched inner leads 21a and 23a (among which the branched inner leads 23a are not shown) by using one and common insulating member in this embodiment. The insulating member 31 is made of a material having an insulating property and an adhesive strength such as polyimide and silicon rubber. For the connection, the insulating member 31 having previously been made into the shape of a tape is used to connect the support members 30 with the inner lead groups 21 through 24 and the branched inner leads 21a and 23a, or a liquid adhesive resin such as a polyimide resin is applied between the support members 30 and the inner lead groups 21 through 24 and the branched inner leads 21a and 23 in the shape of a ring so as to connected them with one another. The insulating member 31 is formed at a position excluding the areas where the inner leads are wired to one another.

In the production method of this embodiment, the support members 30 and the inner lead groups 21 through 24 are connected by using one and common insulating member 31. However, for example, the support members 30 extending from the die pad 20 can be partially connected with the branched inner leads 21a and 23a, so as to support the die pad 20. In this embodiment, the insulating member 31 is provided on the front surface of the lead frame.

Then, as is shown in FIG. 10(c), as a third step, the connection areas 30x between the support members 30 and the branched inner leads 21a and 23a are cut off from the lead frame body having the insulating member 31. Thus, a second lead frame body 38 is fabricated. Through this procedure, the support members 30 are connected with the inner lead groups 21 through 24 via the insulating member 31. In other words, the die pad 20 is supported by the inner lead groups 21 through 24 via the support members 30 and the insulating member 31.

In this embodiment, for the formation of the first through fourth inner lead groups 21 through 24 in the first step, the first lead frame body 37 is fabricated so as to have the branched inner leads 21a and 23a at the both ends of the first and third inner lead groups 21 and 23 connected with the support members 30. Therefore, the die pad 20 can be supported by the branched inner leads 21a and 23a until the support members 30 are separated from the branched inner leads 21a and 23a in the third step. Thus, the configuration of the lead frame of the second embodiment shown in FIG. 3 can be realized with ease. However, there is no need to connect the support members 30 and the branched inner leads 21a and 23a in the first lead frame body 37, but the support members 30 can be connected with other inner leads on the other side of and adjacent to the branched inner leads 21a and 23a. Alternatively, the support members 30 can be connected with other inner leads on both sides of and adjacent to the branched inner leads 21a and 23a.

According to this embodiment, some of the inner leads belonging to a specific inner lead group can be disposed across a line between the tip of the support member 30 and a portion of the dam bar 29 opposing the tip of the support member 30 (i.e., the corner of the dam bar 29 in this embodiment), so that the tips of these inner leads can be aligned with the tips of the inner leads of the adjacent inner lead group. Specifically, it is possible to fabricate a lead frame in which the inner leads can be appropriately led in accordance with the number of the bonding pads of the semiconductor chip.

It is noted that the die pad 20 can be subjected to a surface processing to provide an irregular surface if necessary. Such an irregular surface can improve the adhesion of the semiconductor chip to an adhesive agent to be used.

(Embodiment 9)

The ninth embodiment regarding a resin sealed semiconductor device using a lead frame will now be described.

Figure 11:
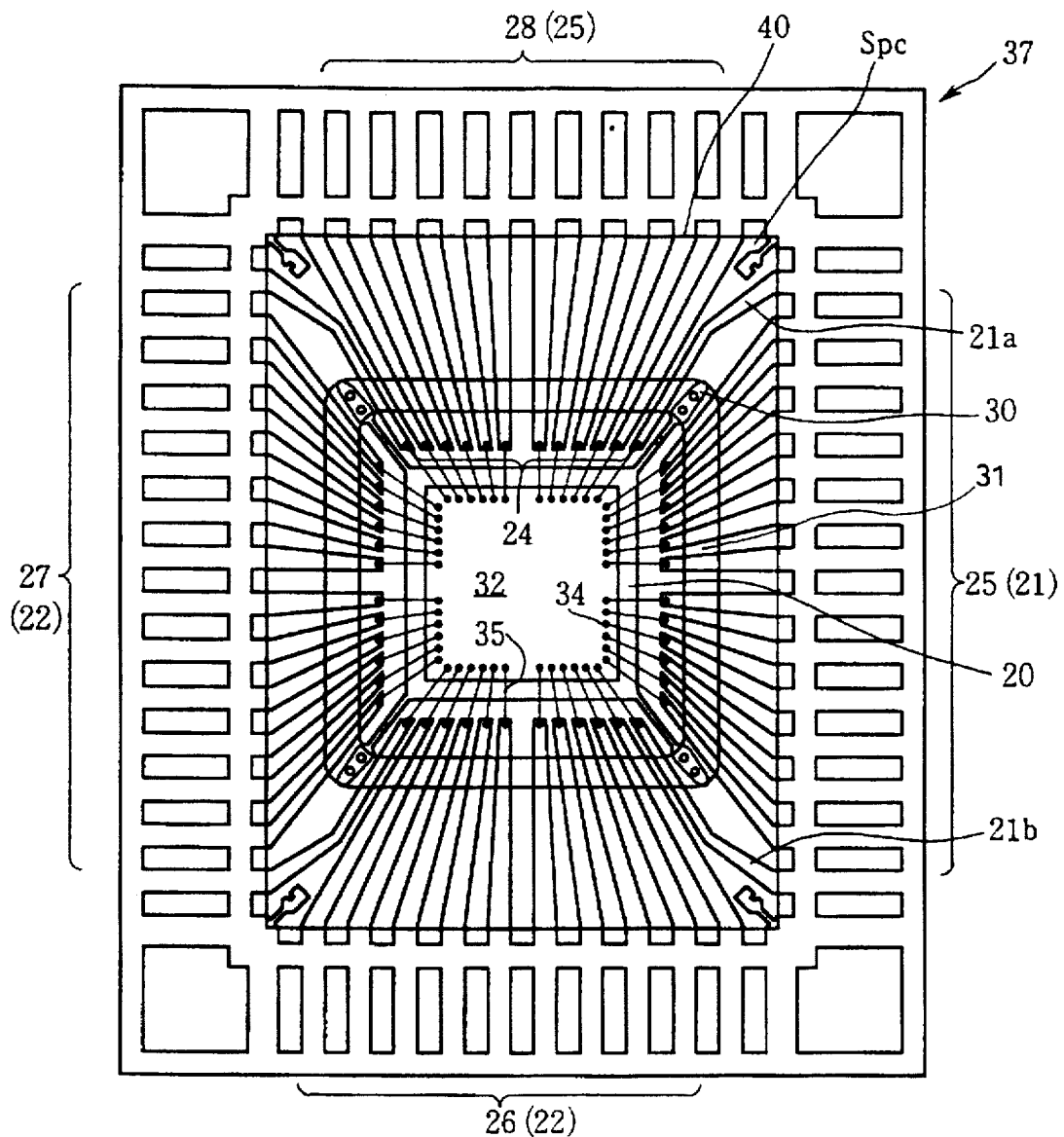
FIG. 11 is a plane view of a resin sealed semiconductor device according to a tenth embodiment of the invention.

FIG. 11 is a plane view for showing the state of a resin sealed semiconductor device according to this embodiment after completing resin sealing. A lead frame of this embodiment has the same configuration as that of the second embodiment, and hence description regarding the configuration of the lead frame is omitted. In FIG. 11, the resin is shown to be completely transparent for convenience. The resin sealed semiconductor device of this embodiment comprises metal wires 35 of gold (Au) or aluminum (Al) for electrically connecting the inner leads of the inner lead groups 21 through 24 with the bonding pads 34 of the semiconductor chip 32, and a sealing resin 40 such as an epoxy resin for sealing an area occupied by the semiconductor chip 32, the inner lead groups 21 through 24, the branched inner leads 21a and 23a, the support members 30, the insulating member 31 and the like.

The insulating member 31 of this embodiment is made of a tape-shaped polyimide resin, but the insulating member 31 can be formed by applying an insulating resin such as a polyimide resin. Also, in connecting the support members 30 with the inner lead groups 21 through 24 and the branched inner leads 21a and 23a by using the tape-shaped insulating member 31, the insulating member 31 is adhered to the front surfaces of the inner lead groups 21 through 24 and the branched inner leads 21a and 23 in this embodiment, but it is possible to adhere the insulating member 31 on the back surfaces thereof. Furthermore, in this embodiment, the support members 30 are provided in the vicinity of the corners of the die pad 20, but the support members 30 can be freely disposed at other positions such as the ends and the centers of the sides of the die pad 20 and the like in view of the alignment of the inner leads.

Specifically, in the resin sealed semiconductor device of this embodiment, since the number of the inner leads connected with the loner sides of the lead frame is larger, some of the inner leads are branched to be led to the areas where the inner lead groups connected with the shorter sides are aligned. According to the present resin sealed semiconductor device, the die pad lead conventionally used for supporting the die pad 20 can be eliminated, so that the space Spc conventionally occupied by the die pad lead can be effectively utilized. Thus, some of the inner leads are led from the longer sides to the shorter sides, thereby realizing an appropriate pitch between the inner leads. Accordingly, it is possible to prevent the metal wires 35 from coming in contact with one another in a wire bonding process for disposing the metal wires 35 and in the resin injection process, thereby preventing an electrical short-circuit and the like from occurring. Thus, the embodiment can realize a resin sealed semiconductor device having improved reliability.

The semiconductor chip substantially in the shape of a square is mounted on the lead frame substantially in the shape of a rectangle in this embodiment. However, when a semiconductor chip substantially in the shape of a rectangle is mounted on a lead frame substantially in the shape of a square, it is also possible to branch some of the inner leads to be led to the adjacent areas in view of the wiring efficiency.

Now, the production method for the resin sealed semiconductor device will be described.

First, in a first step, either the procedures described in the seventh embodiment shown in FIGS. 9(a) through 9(c) or those described in the eighth embodiment shown in FIGS. 10(a) through 10(c) are adopted, thereby fabricating a lead frame having the second lead frame body 37 as is shown in FIG. 11.

Then, in a second step, the semiconductor chip 32 is mounted on the die pad 20 of the lead frame. In this step, the semiconductor chip 32 is adhered to the die pad 20 by using a conductive adhesive agent such as silver paste.

Next, in a third step, the semiconductor chip 32 is electrically connected with the respective inner leads of the lead frame. In this step, a wire bonding method using metal wires of gold (Au), aluminum (Al) or the like is generally adopted. It is also possible to adopt a bump connection method if necessary.

Then, in a fourth step, the sealing resin is injected into the area occupied by the semiconductor chip 32, the inner lead groups 21 through 24 and the branched inner leads 21a and 23a, the support members 30, the insulating member 31 and the like, so as to seal this area with the resin. In this sealing procedure, an epoxy resin or the like can be used as the sealing resin, and the procedure can be conducted by a transfer molding method or a printing method. When the transfer molding method is used for sealing, the resin is injected through a gate opening of the lead frame.

(Other embodiments)

Figure 12:
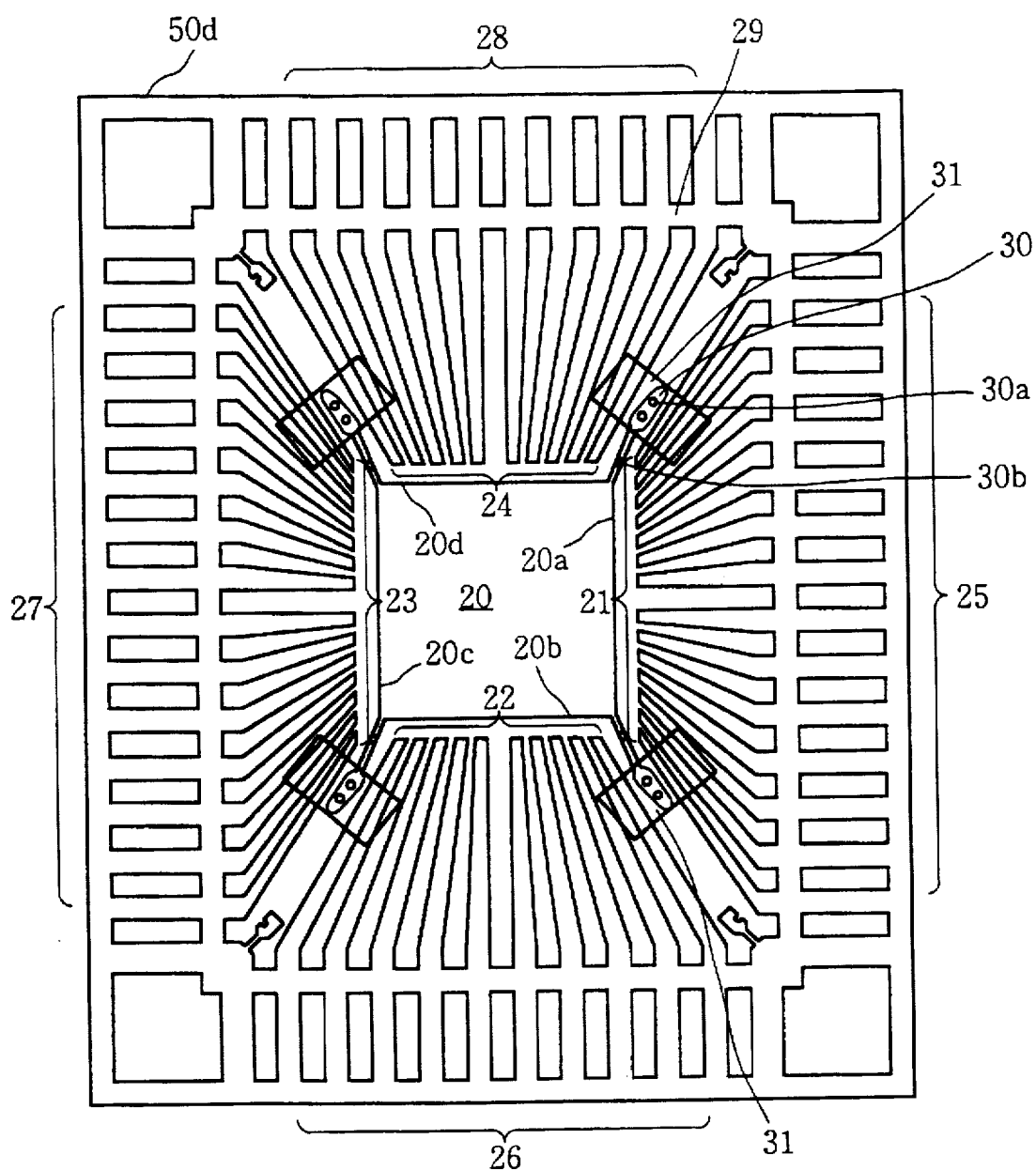
FIG. 12 is a plane view of a lead frame according to another embodiment of the invention.

In the aforementioned embodiments, the insulating member 31 is formed as a square ring-shaped tape, but the invention is not limited to this shape of the insulating member 31. FIG. 12 is a plane view of a lead frame in which the insulating member 31 is formed not as a ring but as small rectangular pieces. Specifically, each support member and some of adjacent inner leads are connected by each insulating member 31. In such a configuration, the same effects as those of the first embodiment can be attained, and in addition, when an expensive insulating tape is used, this configuration results in a lower production cost. It goes without saying that the insulating members as shown in FIG. 11 can be applied also to the second embodiment.

Furthermore, in the lead frames of the aforementioned embodiments, the leads are divided into the inner leads and the outer leads, and the outer leads are bound to one another by the dam bar. However, the invention is not limited to this. It is not always necessary to provide the dam bar, and when the dam bar is omitted, the tip of each support member is extended to a position away from the outer frame with a predetermined distance therebetween.

In the third embodiment, the following arrangement is also applicable: The first and third outer frames 50a and 50c are assumed to be longer among the first through fourth outer frames 50a through 50d. The end inner leads belonging to the first and third inner lead groups 21 and 23 connected with the longer outer frames 50a and 50c are branched, so that the tips of these branched inner leads are aligned in areas where the tips of the second and fourth inner lead groups 22 and 24 are arranged.

Furthermore, in the aforementioned embodiments, at least four support members are disposed, but it is possible to provide two or three support members. At least two support members can effectively support the die pad.

What is claimed is:

1. A lead frame comprising:
   outer frames for surrounding a predetermined space;
   a die pad disposed in the space surrounded by the outer frames for mounting a semiconductor chip having electrodes;
   a plurality of leads extending from the outer frames to the vicinity of positions where the electrodes of the semiconductor chip are to be formed so as to be electrically connected with the electrodes of the semiconductor chip;
   at least two support members extending from the die pad to positions away from the outer frames by a predetermined distance and each having a free tip portion; and
   at least one insulating member for connecting the support members with at least one of the plural leads.

2. The lead frame according to claim 1, wherein each of the support members is connected with all the leads via a common ring-shaped insulating member.

3. The lead frame according to claim 1,
   wherein the outer frames are formed in the shape of a rectangle having four sides,
   the die pad is designed to mount the semiconductor chip in the shape of a rectangle having the electrodes along each side thereof in such a manner that the sides of the semiconductor chip are respectively parallel to the outer frames, and
   tips of the leads are aligned so as to form a an approximately rectangular pattern having four sides respectively parallel to the outer frames.

4. The lead frame according to claim 3,
   wherein a tip of at least one specific lead among the plural leads is aligned along one side of the approximately rectangular pattern formed by the tips of the leads, the side being adjacent to another side parallel to the outer frame with which the specific lead is connected.

5. The lead frame according to claim 4,
   wherein the support members are disposed at corners of the die pad.

6. The lead frame according to claim 5,
   wherein a tip of at lease one specific lead among the plural leads is aligned along one side of the approximately rectangular pattern formed by the tips of the leads, the side being adjacent to another side parallel to the outer frame with which the specific lead is connected.

7. The lead frame according to claim 1,
   wherein each of the support members has a larger width at the free tip portion.

8. The lead frame according to claim 1,
   wherein each of the support members has a through hole at the free tip portion.

9. The lead frame according to claim 1,
   wherein the insulating member is made of a tape-shaped insulating material to which an adhesive agent is applied.

10. The lead frame according to claim 1,
    wherein the die pad has an area smaller than an area of the semiconductor chip to be mounted thereon.

11. The lead frame according to claim 1,
    wherein the die pad is separated into a plurality of portions.

12. A resin sealed semiconductor device comprising:
    outer frames for surrounding a predetermined space;
    a die pad disposed in the space surround by the outer frames;
    a semiconductor chip having electrodes to be mounted on the die pad;
    a plurality of leads extending from the outer frames to the vicinity of the electrodes of the semiconductor chip;
    connecting members for connecting the leads with the electrodes of the semiconductor chip;
    at least two support members extending from the die pad to positions away from the outer frames by a predetermined distance and each having a free tip portion;
    at lease one insulating member for connecting each of the support members with at least one of the plural leads; and
    a resin member for sealing an area including the die pad, the semiconductor chip, part of each of the plural leads, the connecting members, the support members and the insulating member, wherein the free tip portion is buried in the resin member.

13. The resin sealed semiconductor device according to claim 12,
    wherein the outer frames are formed in the shape of a rectangle having four sides,
    the semiconductor chip is in the shape of a rectangle having four sides respectively parallel to the outer frames and has the electrodes along the sides thereof, and
    tips of the leads are aligned so as to form an approximately rectangular pattern obtained by similarly enlarging the sides of the semiconductor chip, and a tip of at least one lead among the plural leads is extended from one specific outer frame among the outer frames to be aligned along one side of the approximately rectangular pattern formed by the tips of the leads which is not parallel to the specific outer frame.

14. A lead frame comprising:

a die pad for mounting a semiconductor chip having plural electrodes;

a plurality of inner leads extending in such a fashion that tip portions of the inner leads are in the vicinity of respective positions where the electrodes of the semiconductor chip are to be formed;

a plurality of outer leads extending outward which are formed to be respectively continuous with the plurality of inner leads;

a dam bar for connecting and fixing the plurality of outer leads;

a support member extending from the die pad and having a free tip portion at a predetermined distance from the dam bar so that a given space is present between the dam bar and the support member; and an insulating member for connecting the free tip portion of the support member with at least one of the plurality of inner leads.

15. A lead frame for packaging a semiconductor chip including first, second, third and fourth sides and first, second, third and fourth electrode groups in the vicinity of the respective first-to-fourth sides, each group being composed of plural electrodes, a die pad for mounting the semiconductor chip;

first, second, third and fourth inner lead groups, each group being composed of plural inner leads, extending to the vicinity of respective positions where the first-to-fourth sides of the semiconductor chip are to be formed and being aligned at tips along respective lines parallel to the first-to-fourth sides of the semiconductor chip;

a frame member forming a ring in the shape of a rectangle composed of first, second, third and fourth outer frames which are connected to one another and arranged nearly parallel to the respective first-to-fourth sides of the semiconductor chip, connecting portions of the first-to-fourth outer frames forming respective corners of the rectangle;

first, second, third and fourth outer groups which are respectively connected to the first-to-fourth outer frames, each group being composed of plural outer leads extending toward the frame member;

a dam bar for connecting and fixing the outer leads;

a support member extending from the die pad toward the corner of the frame member and having a free tip portion at a predetermined distance from the dam bar so that a given space is present between the dam bar and the support member; and an insulating member for connecting the support member with at least one of the plural inner leads, wherein at least one group out of the first-to-fourth inner lead groups includes an inner lead extending across the given space between the dam bar and the support member to be connected to an outer lead of one group out of the first-to-fourth outer lead groups which is connected to one outer frame out of the first-to-fourth outer frames which is adjacent to a different outer frame which is arranged nearly parallel to the group of inner leads.

16. A semiconductor device comprising:

a die pad;

a semiconductor chip in the shape of a rectangle having first, second, third and fourth sides, which is mounted on the die pad;

first, second, third and fourth electrode groups respectively located in the vicinity of the first-to-fourth sides of the semiconductor chip, each group being composed of plural electrodes;

first, second, third and fourth inner lead groups, each group being composed of plural inner leads, being aligned at tips along respective lines parallel to the first-to-fourth sides in the vicinity of the electrodes of the semiconductor chip;

a plurality of connecting members for connecting the plural inner leads with the plural electrodes, respectively;

first, second, third and fourth outer lead groups, each group being composed of plural outer leads, being aligned at tips along respective lines parallel to the first-to-fourth sides of the semiconductor chip, the tips forming an approximate rectangle;

a resin member for sealing an area including the die pad, the inner leads and the connecting members;

a support member extending from the die pad to a position at a predetermined distance from a corner of the approximate rectangle formed by the tips of the first-to-fourth outer lead groups and having a free tip portion buried in the resin member; and an insulating member for connecting the support member with at least one of the plural inner leads, wherein most inner leads of one group out of the first-to-fourth inner lead groups are respectively connected to outer leads of one group out of the first-to-fourth outer lead groups which is labelled with the same ordinal number as the inner lead group, and at least one inner lead out of the inner lead group is connected to one outer lead of a different outer lead group which is adjacent to the outer lead group labelled with the same ordinal number as the inner lead group.

* * * * *

UNITED STATES PATENT AND TRADEMARK OFFICE
CERTIFICATE OF CORRECTION

PATENT NO. : 5,708,295
DATED : January 13, 1998
INVENTOR(S) : Akira OGA et al.

It is certified that error appears in the above-indentified patent and that said Letters Patent is hereby corrected as shown below:

<u>Col. 17</u>, line 62, after "form" delete "a".
<u>Col. 18</u>, line 8, delete "lease" and insert --least--.

Signed and Sealed this

Twenty-first Day of April, 1998

Attest:

BRUCE LEHMAN

*Attesting Officer*  *Commissioner of Patents and Trademarks*